(12) United States Patent
Kawamura et al.

(10) Patent No.: US 7,547,094 B2
(45) Date of Patent: Jun. 16, 2009

(54) LIQUID DISCHARGE RECORDING HEAD AND INK JET RECORDING APPARATUS

(75) Inventors: Shogo Kawamura, Numazu (JP); Toshihiro Mori, Kawasaki (JP); Hisashi Fukai, Yokohama (JP); Naoki Nakajo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 481 days.

(21) Appl. No.: 11/358,203

(22) Filed: Feb. 22, 2006

(65) Prior Publication Data

US 2006/0139410 A1    Jun. 29, 2006

Related U.S. Application Data

(63) Continuation of application No. PCT/JP2005/022990, filed on Dec. 8, 2005.

(30) Foreign Application Priority Data

| Dec. 8, 2004 | (JP) | ............................ 2004-354793 |
| Dec. 13, 2004 | (JP) | ............................ 2004-359934 |
| Jul. 25, 2005 | (JP) | ............................ 2005-214675 |
| Nov. 4, 2005 | (JP) | ............................ 2005-320984 |

(51) Int. Cl.
  *B41J 2/14* (2006.01)
  *B41J 2/16* (2006.01)

(52) U.S. Cl. .......................................... 347/50; 347/58

(58) Field of Classification Search ................. 347/20, 347/49, 50, 56–59; 257/666, 668, 669, 674, 257/672, 773, 775

See application file for complete search history.

(56) References Cited

U.S. PATENT DOCUMENTS 4,947,191 A    8/1990    Nozawa et al.

6,074,543 A    6/2000    Yoshihira et al.
6,084,612 A *  7/2000    Suzuki et al. ................. 347/50

(Continued)

FOREIGN PATENT DOCUMENTS

JP    8-48042    2/1996

(Continued)

OTHER PUBLICATIONS

International Preliminary Report on Patentability, issued Jun. 13, 2007, in PCT/JP2005/022990.

*Primary Examiner*—Juanita D Stephens
(74) *Attorney, Agent, or Firm*—Fitzpatrick, Cella, Harper & Scinto

(57) ABSTRACT

A liquid discharge recording head includes a recording element with a discharge port for discharging liquid and an electrically connecting portion arranged adjacent to the discharge port and receiving an electric signal for controlling the discharge of the discharge port. The liquid discharge recording head further includes a flexible wiring substrate for covering at least a portion of the recording element. The flexible wiring substrate includes each of a device hole for exposing the discharge port and a bonding hole arranged facing the electrically connecting portion independently. The liquid discharge recording head further includes a sealing agent for covering at least a portion of the electrically connecting portion and filled to at least a portion of the bonding hole. Thus, a liquid discharge recording head that enhances recording performance and that has superior productivity while maintaining reliability of the recording performance is provided.

14 Claims, 22 Drawing Sheets

U.S. PATENT DOCUMENTS

| | | |
|---|---|---|
| 6,260,958 B1 | 7/2001 | Yoshihira et al. |
| 6,302,504 B1 | 10/2001 | Imanaka et al. |
| 6,536,868 B1 | 3/2003 | Kawamura et al. |
| 6,752,492 B2 | 6/2004 | Hirosawa et al. |
| 6,877,839 B2 | 4/2005 | Kawamura et al. |
| 6,910,759 B2 | 6/2005 | Kawamura et al. |
| 7,115,975 B2 | 10/2006 | Mori |
| 2006/0139410 A1 | 6/2006 | Kawamura et al. |

FOREIGN PATENT DOCUMENTS

| | | |
|---|---|---|
| JP | 10-776 | 1/1998 |
| JP | 2001-130001 | 5/2001 |
| JP | 2002-331667 | 11/2002 |

* cited by examiner

LIQUID DISCHARGE RECORDING HEAD AND INK JET RECORDING APPARATUS

This application is a continuation of International Application No. PCT/JP2005/022990, filed Dec. 8, 2005, which claims the benefit of Japanese Patent Application No. 2004-354793, filed Dec. 8, 2004, Japanese Patent Application No. 2004-359934, filed Dec. 13, 2004, Japanese Patent Application No. 2005-214675, filed Jul. 25, 2005, and Japanese Patent Application No. 2005-320984, filed Nov. 4, 2005.

BACKGROUND OF THE INVENTION

1. Field of the Invention

The present invention relates to a liquid discharge recording head and an ink jet recording apparatus, in particular, to a sealing structure of an inner lead mounting part in the liquid discharge recording head.

2. Related Background Art

The recording apparatus of liquid discharge method such as an ink jet printer is a so-called recording apparatus of non-impact recording method that is capable of fast recording, and recording on various recording media, and that has a feature of barely producing noise during recording. Thus, the recording apparatus of liquid discharge method is widely adopted as a recording apparatus of a printer, a word processor, a facsimile, a copying machine and the like.

FIGS. 22A and 22B show the main parts of the liquid discharge recording head according to one conventional example, where 22A is a perspective view showing the discharging surface, and 22B is a perspective view of the opposite surface of FIG. 22A.

As shown in FIG. 22A, the recording head 1001 serving as a liquid discharge recording head is configured by a recording element 1100, a flexible wiring substrate 1300, a support member 1500 and the like. The recording element 1100 heats the ink with an electrothermal conversion body serving as a heating resistance element, and discharges the ink droplets through the action of film boiling. The flexible wiring substrate 1300 applies driving signal and the like from the device main body (not shown) to the recording element 1100. The support member 1500 forms an ink flow path for supplying ink from the ink tank (not shown) to the recording element 1100.

The support member 1500 connected to the ink tank includes a filter 1504 and a sealing rubber, 1505 at the connecting part, and forms a flow path for leading the ink from the ink tank to the recording element 1100, as shown in FIG. 22B.

As shown in an exploded perspective view of FIG. 23, the supply port (not shown) of the recording element 1100 is connected by an adhesive 1501 in correspondence to the ink supply port 1506 serving as an outlet of the flow path. The recording element 1100 is electrically connected to the flexible wiring substrate 1300 having an opening 1303 for incorporating the element. Specifically, the flexible wiring substrate 1300 is fixed to the support member 1500 with the adhesive 1501 so that the inner lead 1302 of the flexible wiring substrate 1300 is connected to the electrode part 1103 of the recording element 1100 adhered and fixed to the support member 1500. Further, the location having an external signal input terminal 1301 for inputting the drive signal and the like from the device main body with respect to the flexible wiring substrate 1300 is adhered and fixed to the side surface of the support member 1500 by the adhesive 1503.

FIGS. 24A and 24B are explanatory views showing the assembly steps of the recording head 1001. A nozzle plate 1102 with a plurality of discharge ports 1101 and an electrode part 1103 are provided on the main surface of the recording element 1100, and are incorporated in the opening 1303 of the flexible wiring substrate 1303. The inner lead 1302 is also arranged in the opening 1303. A gold, bump 1104 is formed on the electrode part 1103, and the inner lead 1302 and the electrode part 1103 are electrically connected through TAB (Tape Automated Bonding) mounting technique by way of the bump 1104 (refer to Japanese Patent Application Laid-Open No. Hei 10-000776).

As shown in FIG. 25A, the periphery of the side wall 1107 of the recording element 1100 is sealed with a first sealing agent 1201. Further, the electrically connecting portion by the inner lead 1302 is sealed with a second sealing agent 1202, so that the electrically connecting portion is protected from corrosion due to ink and external force (refer to Japanese Patent Application Laid-Open No. 2001-130001).

However, the above prior arts have disadvantages. That is, as shown in FIG. 25B, those of low viscosity is used for the first sealing agent 1201 to be filled to the periphery of the side surface of the recording element 1100 so as to be penetrated to the back surface of the electrically connecting portion that cannot be directly applied. The material having flexibility to be elastically deformed is used so that the sealing agent 1201 does not apply excess stress to the recording element 1100. The second sealing agent 1202 for sealing the front side of the electrically connecting portion must have high viscosity and rigidity against external force so as not to spread across the surface of the nozzle plate 1102 including a plurality of discharge ports 1101. Thus, the sealing agent having properties different from the first sealing agent 1201 must be used for the second sealing agent 1202, and the usage of two types of sealing agents increases the material cost.

In order to reliably seal the electrically connecting portion with the sealing agent 1202 having high viscosity and low fluidity, the sealing agent 1202 is overlapped by a distance L1 from the edge of the opening 1303, and must be applied at a height of about H1 on the base film 1307.

Recently, the size of the discharged liquid tends to be increasingly microscopic due to the demand of higher fineness of the image recording quality. If each ink discharged amount from the nozzle is made into a smaller liquid to a size of 1 pl (pico liter) or less, the image recording quality is easily influenced by air current or movement speed of the recording head. Thus, in order to have the recording liquid land at a suitable position, it is extremely important to have the distance (distance to papers) between the discharge port surface of the recording head and the recording medium (recording paper and the like) reduced as much as possible. In a recording apparatus, a spacing of about 2 mm is formed between the recording head 1001 and the recording medium such as recording paper so that they do not come in contact with each other. However, the higher the height of the sealing agent 1202 on the flexible wiring substrate 1300, the spacing between the nozzle plate 1102 and the recording medium must be made larger, which causes lowering of image recording quality. In other words, in the conventional configuration described above, the expanded second sealing agent is likely to contact the recording medium, which is one cause of inhibiting reduction of the distance to papers.

A technique for preventing the spread of sealing agent across the nozzle plate surface is disclosed in Japanese Patent Application Laid-Open No. Hei 8-048042, for example, but faces a challenge in that height H1 is also required in terms of sealing the base film of the flexible wiring substrate.

SUMMARY OF THE INVENTION

The present invention aims to provide a liquid discharge recording head with improved sealing structure of the electrically connecting portion between the recording element and the flexible wiring substrate.

The present invention also aims to provide a liquid discharging recording head that suppresses the expansion of the sealing agent on the flexible wiring substrate and enhances the image recording quality while preventing the sealing agent from blocking the discharge port and maintaining the reliability of the ink discharge performance.

The present invention also aims to provide a liquid discharge recording head including a recording element with a discharge port for discharging the liquid and an electrically connecting portion arranged adjacent to the discharge port and receiving an electric signal for controlling the discharge of the discharge port; and a flexible wiring substrate for covering at least a portion of the recording element, the flexible wiring substrate including each of a device hole for exposing the discharge port and a bonding hole arranged facing the electrically connecting portion independently The present invention also aims to provide a liquid discharge recording head that stops the sealing material at the peripheral rim of the bonding hole and prevents it from flowing to the device hole side and effectively prevents the flow of the sealing material to the discharge port when the bonding hole facing the electrically connecting portion is provided independently from the device hole.

The present invention also aims to provide an ink jet recording apparatus using the above-described liquid discharge recording head.

BRIEF DESCRIPTION OF THE DRAWINGS

FIG. 4B is a partial cross sectional view taken along line 4B-4B of FIG. 1B and FIG. 4A.

FIG. 22A is a perspective view showing the main part of the recording head, and FIG. 22B is a perspective view showing the opposite side of a support member;

DESCRIPTION OF THE PREFERRED EMBODIMENTS

Figure 1A:
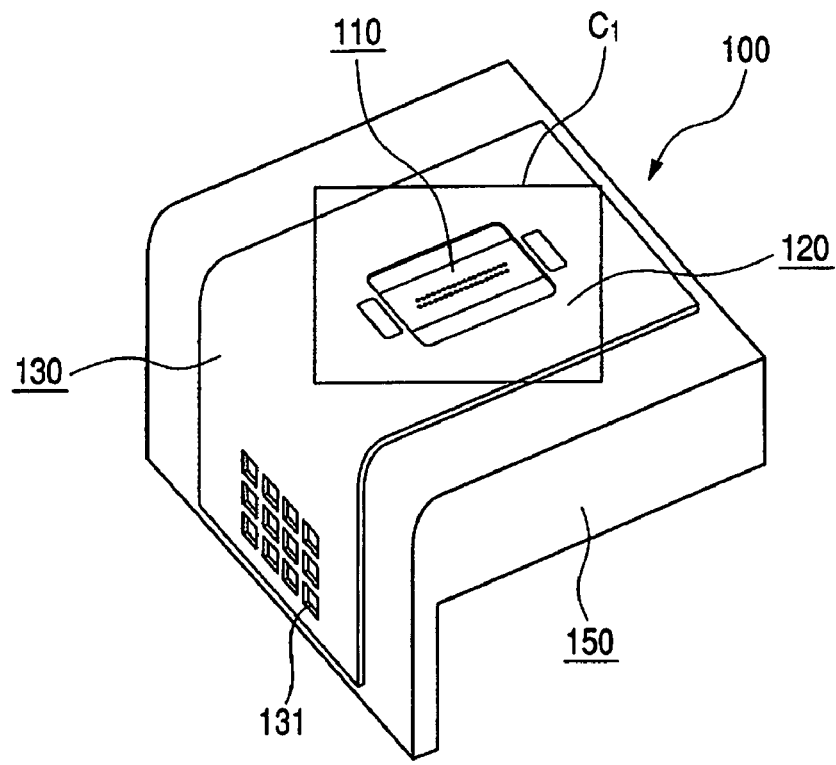
FIGS. 1A and 1B are perspective views showing a recording head according to a first embodiment, where 1A is an entire perspective view, and 1B is an enlarged partial perspective view of a portion circled by a square C1 of FIG. 1A.

The basic configuration of the present invention will now be explained. As shown in FIG. 1, a liquid discharge recording head (hereinafter referred to as recording head 100) includes a recording element 110 including a discharge port 111a (discharge port columns 111) for discharging the liquid, and an electrically connecting portion 21 (refer to FIG. 4) arranged adjacent to the discharge port 111a and receiving the electric signal for controlling the discharge of the discharge port 111a. The recording element 110 includes an energy generating means (not shown) for discharging ink, of liquid. The recording head 100 further includes a flexible wiring substrate 130 extending while covering at least a portion of the recording element 110. The flexible wiring substrate 130 includes a device hole 134 for exposing the discharge port 111a (discharge port column 111), and a bonding hole 135 arranged facing the electrically connecting portion 21. The holes 134, 135 are separated by a separating band 130a, and are arranged independent from each other. The sealing agent 122 covers at least a portion of the electrically connecting portion 21 and is filled to at least a portion of the bonding hole 135. The periphery of the device hole 134 is also sealed by the first sealing agent 121. The flexible wiring substrate 130 includes an inner lead 132 protruding towards the inner side of the bonding hole 135. The recording element 110 includes an electrode part 113 adjacent to the discharge port 111a, and the distal end of the inner lead 132 and the electrode part 113 are electrically connected to form the electrically connecting portion 21.

The separating band 130a for separating the device hole 134 and the bonding hole 135 of the flexible wiring substrate 130 is preferably adhered to the main surface (upper surface in figure) of the recording element 110.

The surface of the nozzle plate 112 of the recording element 110 exposed from the device hole 134 of the flexible wiring substrate 130 is preferably liquid repellent processed.

In order to reduce the manufacturing cost and enhance productivity, the same sealing agent is preferably used as the sealing agents 121, 122 for filling each hole 134, 135.

In the assembly step of the recording head 100, the first sealing agent 121 is first injected to the device hole 134 to fill the periphery of the side surface of the recording element 110 and cure or half-cure the same (state in which at least the sealing agent is cured until fluidity disappears).

Thereafter, the second sealing agent 122 is filled to the bonding hole 135, and the sealing agents 121, 122 of all the holes 134, 135 are completely cured.

First Embodiment

In FIGS. 1A to FIGS. 4B, the liquid discharge recording head of the first embodiment is shown. The recording head 100 serving as the liquid discharge recording head is a side shooter type recording head that performs recording using the recording element 110 having an electrothermal conversion body for generating film boiling according to the electric signal with respect to the ink serving as liquid.

Figure 1B:
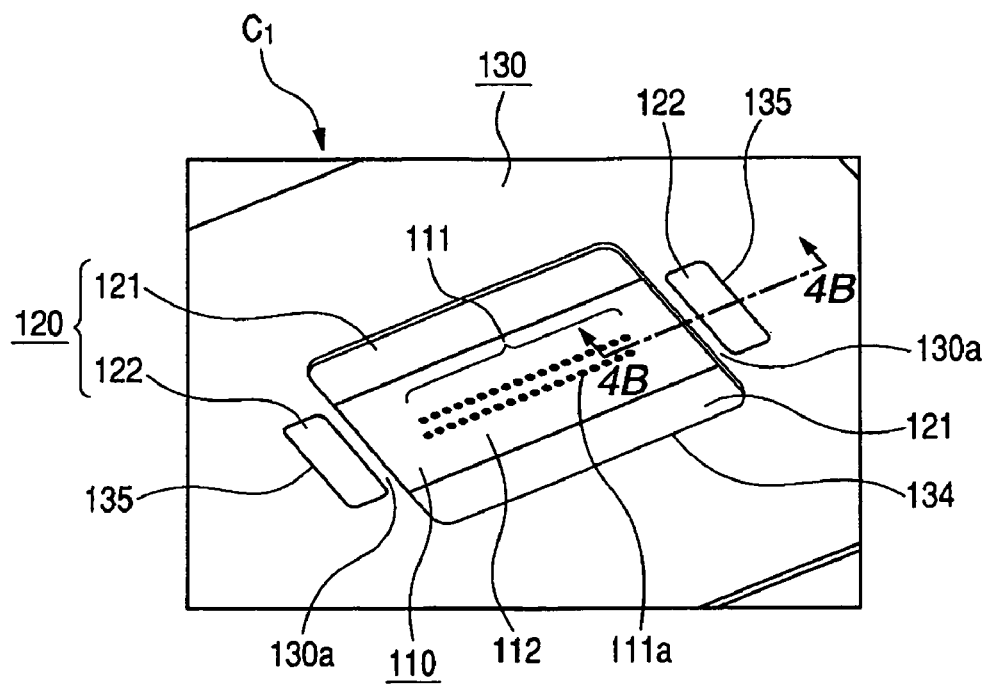

As shown in FIGS. 1A and 1B, the recording head 100 is configured by a recording element 110 with a nozzle plate 112, a flexible wiring substrate 130, a support member 150 serving as a support means for fixing and supporting the above and the like. The flexible wiring substrate 130 includes an external signal input terminal 131 connected to an external wiring (not shown), a device hole 134 for exposing the nozzle plate 112 of the recording element 110, and a pair of bonding holes 135 serving as an auxiliary opening. The side surface of the recording element 110 in the device hole 134 is sealed with the first sealing agent 121. The bonding hole 135 is sealed by the second sealing agent 122 from the surface side of the flexible wiring substrate 130. The fist and second sealing parts 121, 122 configure the sealing section 120. The holes 134, 135 are separated by the separating band 130a.

Figure 3A:
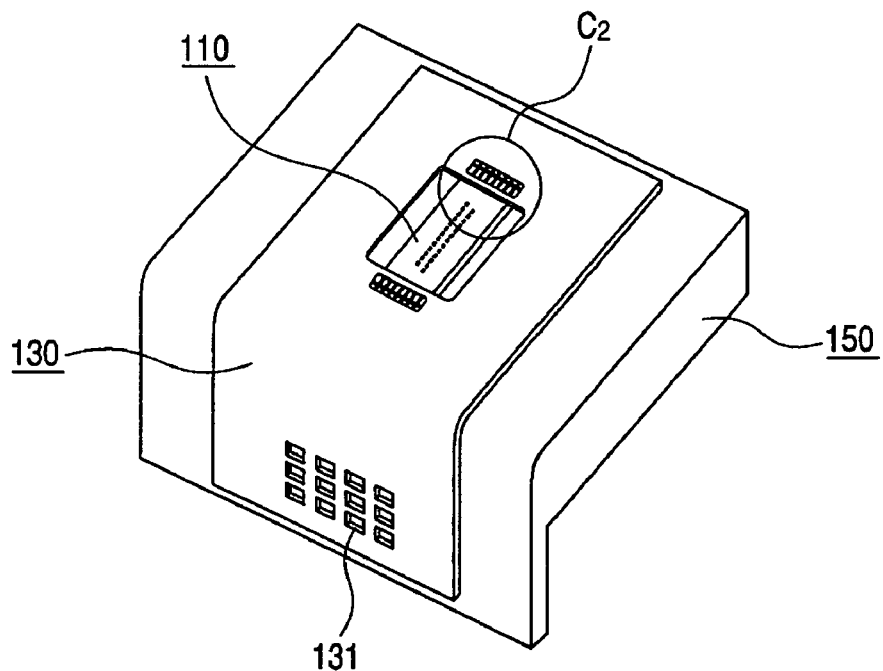
FIGS. 3A and 3B are perspective views showing a state before sealing with the sealing agent of the recording head of FIGS. 1A and 1B, where 3A is the perspective view and 3B is an enlarged partial perspective view of the portion circled with circle C2.
Figure 3B:
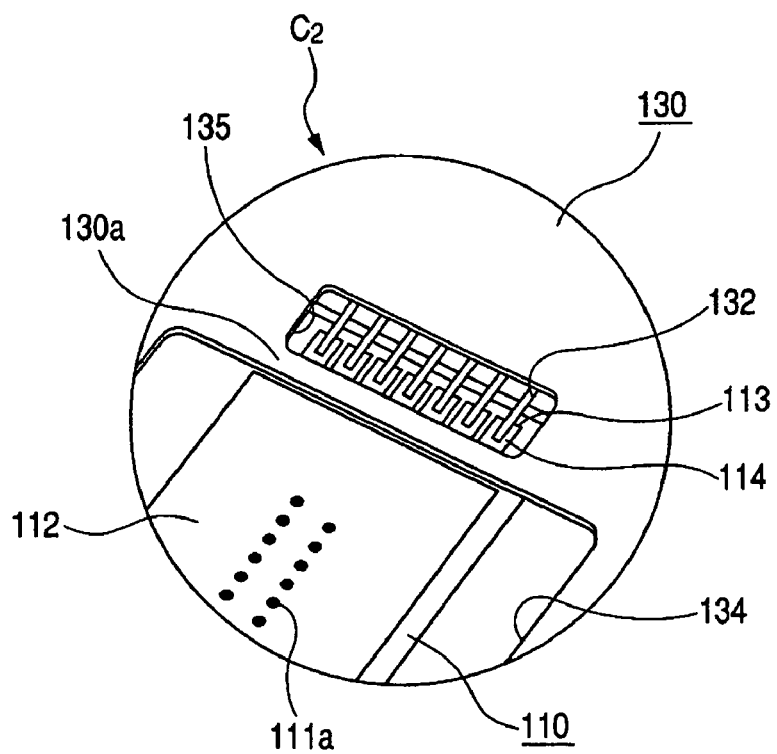

An ink supply port in a shape of a long hole is opened at the middle of the silicon substrate of the recording element 110. The electrothermal conversion body consisting of a plurality of heating resistance bodies is lined on the substrate on both sides of the ink supply port at substantially equiangular interval. The substrate formed with such heating resistance element is referred to as a heater board 110a (refer to FIGS. 4A and 4B). The wiring for supplying power to the heating resistance element is arranged on the main surface of the heater board 110a serving as a main body of the recording element 110, and as shown in FIGS. 3A and 3B, is wire connected with the electrode part 113 arranged on both ends of the recording element 110. The protective film and the nozzle plate 112 with the discharge column 111 consisting of a plurality of discharge ports 111a are formed on the heater board 110a, thus the recording element 110 is completed. The heating resistance element heats the ink by the drive signal from the device main body, and discharges the ink droplet through the action of the film boiling. The surface of the nozzle plate 112 is subjected to liquid repellent process. The thickness of the nozzle plate 112 is for example, 25 μm.

The flexible wiring substrate 130 conveys the drive signal supplied, by way of the external signal input terminal 131, from the main body of the recording apparatus including a conveying means for conveying the recording medium so as to face the recording head 100 to the recording element 110 by the inner lead 132 serving as the electric connecting means. TAB tape, for example, is used as the flexible wiring substrate 130.

Figure 4A:
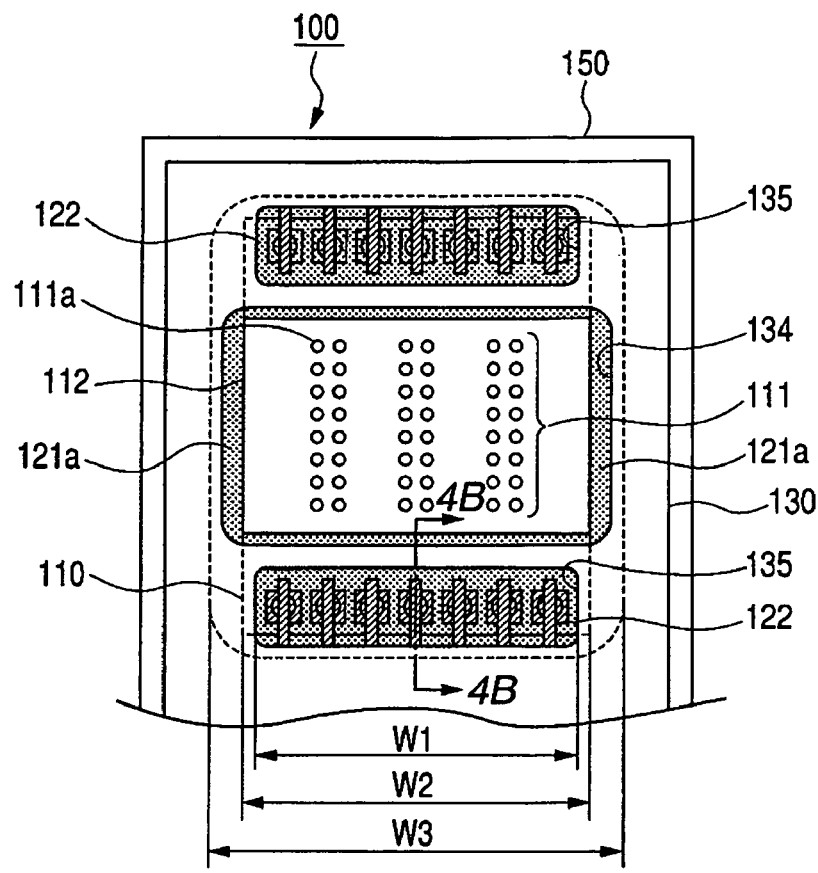
FIGS. 4A and 4B are partial detailed views of the recording head of FIGS. 1A and 1B, where 4A is a partial plan view.
Figure 4B:
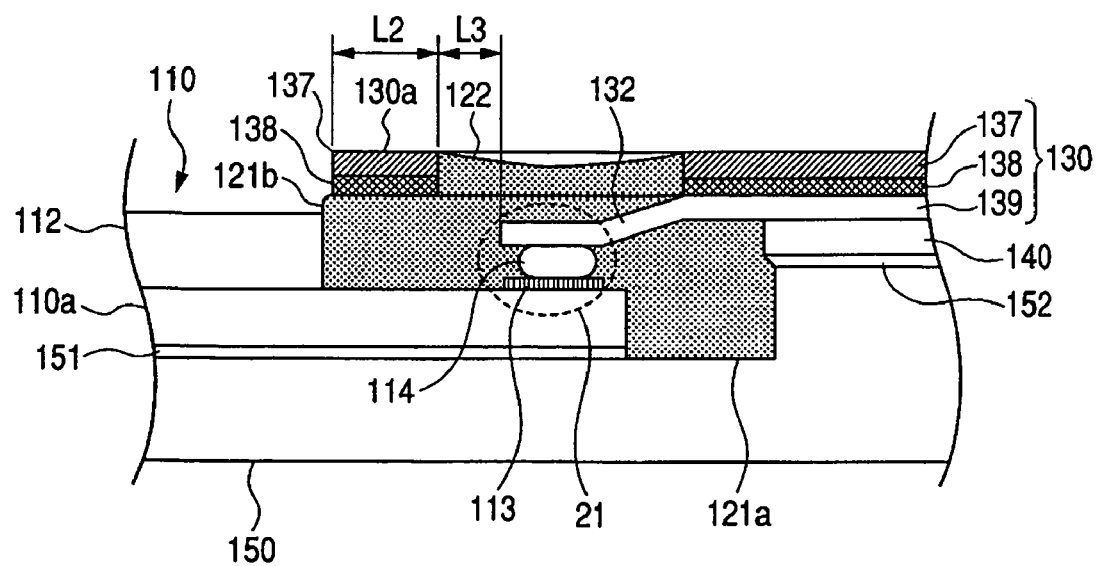

As shown in FIGS. 4A and 4B, the flexible wiring substrate 130 has a stacked structure in which the wiring 139, connected to the inner lead 132, for connecting the base film 137 by way of the adhesive 138 is stacked. The base film 137 is made of insulating resin such as UPILEX or Kapton. The wiring 139 of flat plate shape consists of a plurality of wiring patterns and is obtained by adhering the metal foil made of electric conductive material such as copper foil to the lower surface of the base film 137 and patterning it to the desired shape using photolithography technique. Plating process of gold, tin or solder is performed on the lower surface of the patterned metal foil (wiring 139 of flat plate shape), and the region which metal surface is not desired to be exposed is covered and protected by the resist layer 140 and the like. The thickness of each material is, for example, 50 μm for the base film 137, 20 μm for the adhesive 138, and 25 μm for the wiring 139. The device hole 134 for exposing the nozzle plate 112 and the bonding hole 135 arranged facing the electrically connecting portion 21 are formed on the base film 137 of the flexible wiring substrate 130. The holes 134, 135 are separated by the separating band 130a, a portion of the base film 137.

The width L2 of the separating band 130a is preferably as narrow as possible since the size of the corresponding recording element 110 increases as the width becomes wider. In the present embodiment, the width L2 of the separating band 130a, for example, is 0.35 mm in consideration of the fabricating precision of the die for punching the holes 134, 135 and the rigidity of the base film 137. Further, the distance L3 from the separating band 130a to the distal end of the inner lead 132 is also made as narrow as possible to reduce the size of the corresponding recording element 110. In the present embodiment, the distance L3 is 0.1 mm in consideration of the fabricating precision of the TAB tape.

Figure 2:
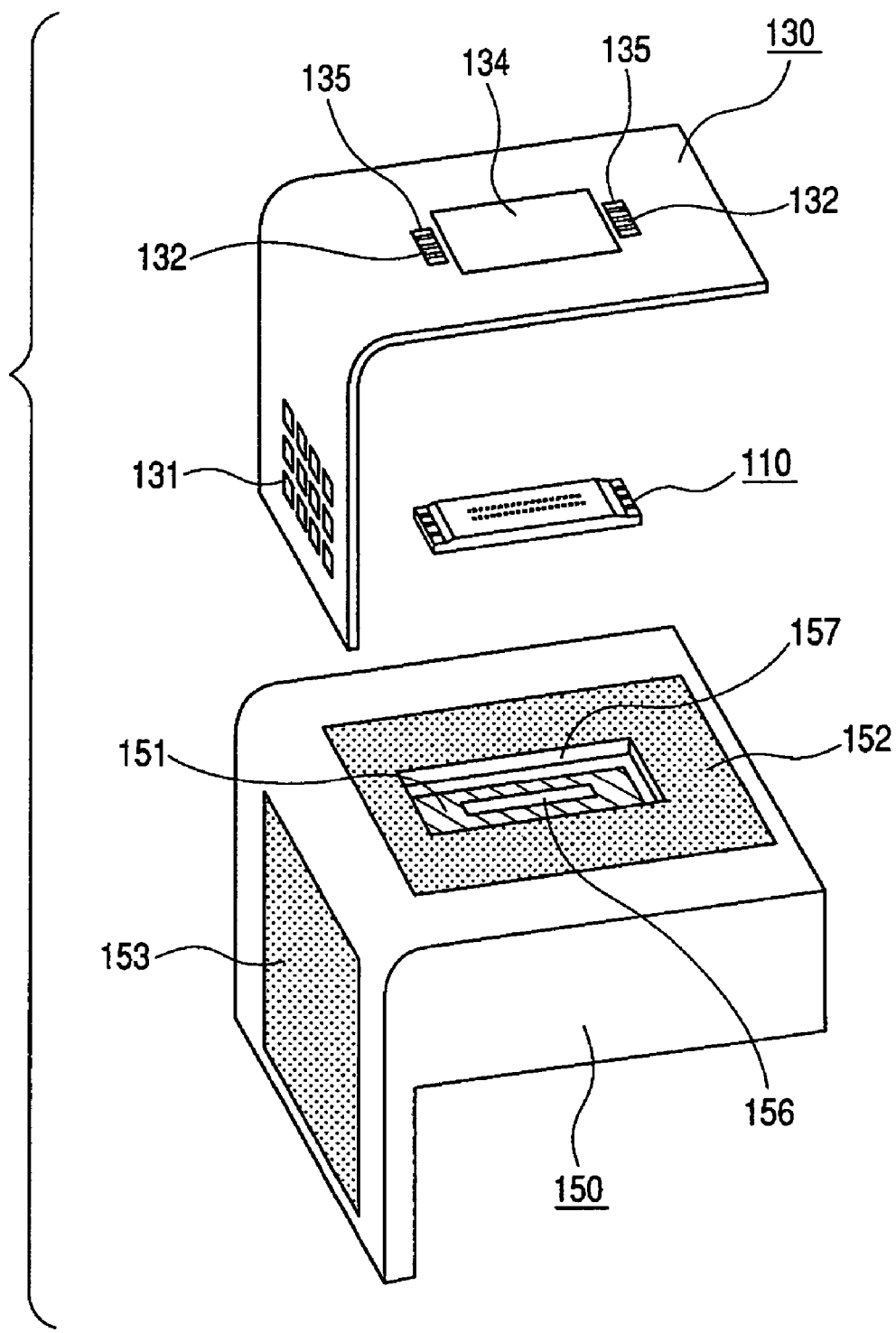
FIG. 2 is an exploded perspective view of the recording head of FIGS. 1A and 1B.

As shown in FIG. 2, and FIGS. 4A and 4B, the recording element 110 is fixed to the support member 150 by the adhesive 151, and the flexible wiring substrate 130 is fixed to the support member 150 by the adhesives 152, 153. The ink flow path 156 for supplying ink from the ink tank (not shown) to the recording element 110 is formed in the support member 150. The filter and the seal rubber are included in the connecting part with the ink tank of the upper surface, and the recording element 110 is incorporated in the recess 157.

After the ink supply port (not shown) of the recording element 110 is positioned in correspondence to the ink flow path 156 arranged in the support member 150, the recording element 110 is fixed by the adhesive 151. The recording element 110 has the main surface consisting of nozzle plate 112 incorporated in the device hole 134 of flexible wiring substrate 130 and electrically connected to inner lead 132 protruding out to the bonding hole 135.

The inner lead 132 is formed protruding from the flexible wiring substrate 130 to the opening of the bonding hole 135. A plurality of electrode parts 113 (electrode pad) configured by aluminum and the like are formed on the surface of the substrate 110. Further, each of the plurality of electrode parts 113 is formed with a bump 114 formed by a ball bump and the like of gold or solder, etc. Gold is selected for the bump 114 when higher reliability is required, and solder is selected when lower cost is required. In FIGS. 4A and 4B, the stud bump is shown, but the bump may be other configuration such as a plated bump. Further, it may be a bump-less configuration in which the inner lead 132 is connected directly to the electrode part 113. The electrode part 113 is positioned at high precision each at one to one ratio with the distal end of the inner lead 132 protruding out to the opening of the device hole 134, and electrically connected.

That is, as shown in FIGS. 3A and 3B, the main part of the flexible wiring substrate 130 is adhered and fixed to support member 150 with the adhesive 152 at a position where the inner lead 132 is connected to the electrode part 113 of the recording element 110 fixed to the support member 150. Similarly, the bent part with the external signal input terminal 131 for receiving the drive signal from the device main body is adhered and fixed to the support member 150 by the adhesive 153. The electrode part 113 of the recording element 110 positioned and fixed as such, and the inner lead 132 of the flexible wiring substrate 130 are electrically connected through the TAB mounting technique by way of the bump 114 arranged on the electrode part 113 to form the electrically connecting portion 21. As a connecting method, the thermosonic method or heating-pressure bonding method can be used. The external signal is supplied to the wiring of the recording element by way of the electrically connecting portion 21.

In the present embodiment, with regards to the inner lead 132, the wiring having copper (Cu) as the main constituent is plated with nickel (Ni) as a nonproliferation layer, and ultimately plated with gold (Au). The bump 114 is formed with gold wire, and electric joining is performed through Au—Au bonding using the single point bonding method. The height of the bump 114 is set so that the inner lead 132 does not protrude out from the base film 137 of the flexible wiring substrate 130 after being joined with the inner lead 132. If adjustment of the height of the bump 114 is difficult, it may be adjusted with the thickness of the support member 150 which the flexible wiring substrate 130 is adhered and fixed.

Next, the first sealing agent 121 is filled to the periphery of the side surface of the recording element 110 from the device hole 134 of the flexible wiring substrate 130. The first sealing agent 121 must be filled to the back side of the electrically connecting portion 21 that cannot be directly applied, and thus those having low initial viscosity and satisfactory fluidity is used. In the present embodiment, the sealing agent of heat curing type, for example, is used. The first sealing agent 121 is heated for about 1 hour to 4 hours at 100° C., for example, to fill the part 121a of the first sealing agent 121 to the entire side surface of the recording element 110, and then half-cured. Simultaneously, a portion 121b of the first sealing agent 120 is filled and half cured in between the recording element 110 and the separating band 130a by capillary phenomenon. Thus, the separating band 130a is adhered and fixed to the main surface of the recording element 110 and the bonding hole 135 becomes a dam shape (refer to FIG. 4).

In the present embodiment, the outer shape of the nozzle plate 112 is made slightly smaller than the device hole 134 to form a step proximate to the separating band 130a and produce surface tension (meniscus effect) between the nozzle plate 112 and the flexible wiring substrate 130. Further, the surface of the nozzle plate 112 is subjected with water repellant process. Due to such configuration, the first sealing agent 121 (121b) is prevented from spreading to the surface of the nozzle plate 112.

Figure 4C:
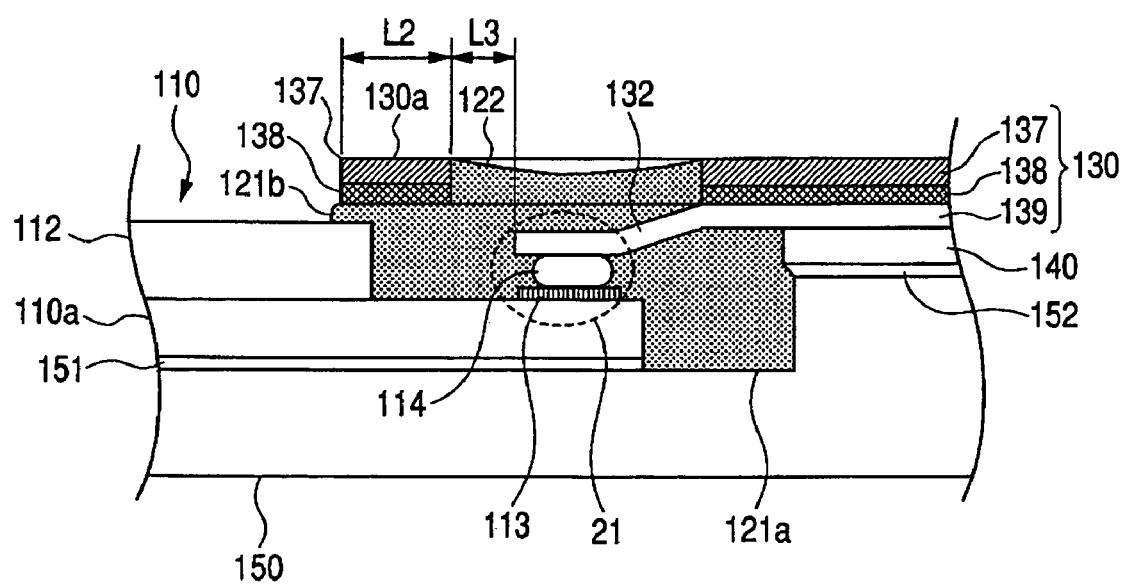
FIG. 4C is a partial cross sectional view of the recording head in which the ends of the nozzle plate and the flexible wiring substrate are overlapped.

However, the outer shape of the nozzle plate 12 may be made larger than the device hole 134 and the nozzle plate 112 and the flexible wiring substrate 130 may be planarly overlapped (FIG. 4C). With such configuration, the first sealing agent 121 advances to between the nozzle plate 112 and the portion of the flexible wiring substrate 130 formed from the base film 137 and the adhesive 138 by the capillary action. However, the first sealing agent 121 is suppressed from diffusing towards the discharge port 111a formed on the nozzle plate 112 by the meniscus effect of the end of the overlapping part, and thus similar advantages are obtained.

The second sealing agent 122 is filled into the bonding hole 135 of dam shape to seal the electrically connecting portion 21. The second sealing agent 122 is filled to a dam shape part with a depth of about 0.1 mm, for example, and thus similarly to the first sealing agent 121, those having low initial viscosity and satisfactory leveling is used. Consequently, the height of the sealing agent 122 is made substantially the same as the surface of the base film 137 of the flexible wiring substrate 130. Further, the outer periphery is surrounded by the base film 137 and is less likely to be subjected to external force, and thus, as to, for example, the wiping mechanism equipped in the main body of the recording apparatus, the external force applied by the wiper blade during contact is reduced. In FIGS. 4A and 4B, the second sealing agent 122 is accommodated inside the bonding hole 135 but may be partially protrudeed to the outside of the bonding hole 135.

In the present embodiment, the sealing agent same as the first sealing agent 121 is used for the second sealing agent 122. By having the first and the second sealing agents 121, 122 made of the same material, the adhesiveness of the two is enhanced. After filling the second sealing agent 122, it is heated at a temperature higher than the thermal processing temperature of half-curing described above, for example, 150° C. for about three hours, and the first sealing agent 121 and the second sealing agent 122 are completely cured.

The heating curing of the sealing agent is performed all together in, an oven managed at a predetermined temperature. Here, the first sealing agent 121 covering the upper surface of the inner lead 132 is softened through heating, and may drop below the inner lead 132. In this case, the first sealing agent 121 is heated and cured (pre-cured) before applying the second sealing agent 122 from the upper surface side of the inner lead 132, and thereafter, the second sealing agent 122 is applied from the upper side of the inner lead 132, and finally may be completely heated and cured all together. In pre-cure, the first sealing agent 121 may be completely cured, or may be half-cured to an extent fluidity disappears. To what state the sealing agent applied from the upper surface side of the inner lead 132 can be appropriately selected so as not to drop below the inner lead.

Figure 12:
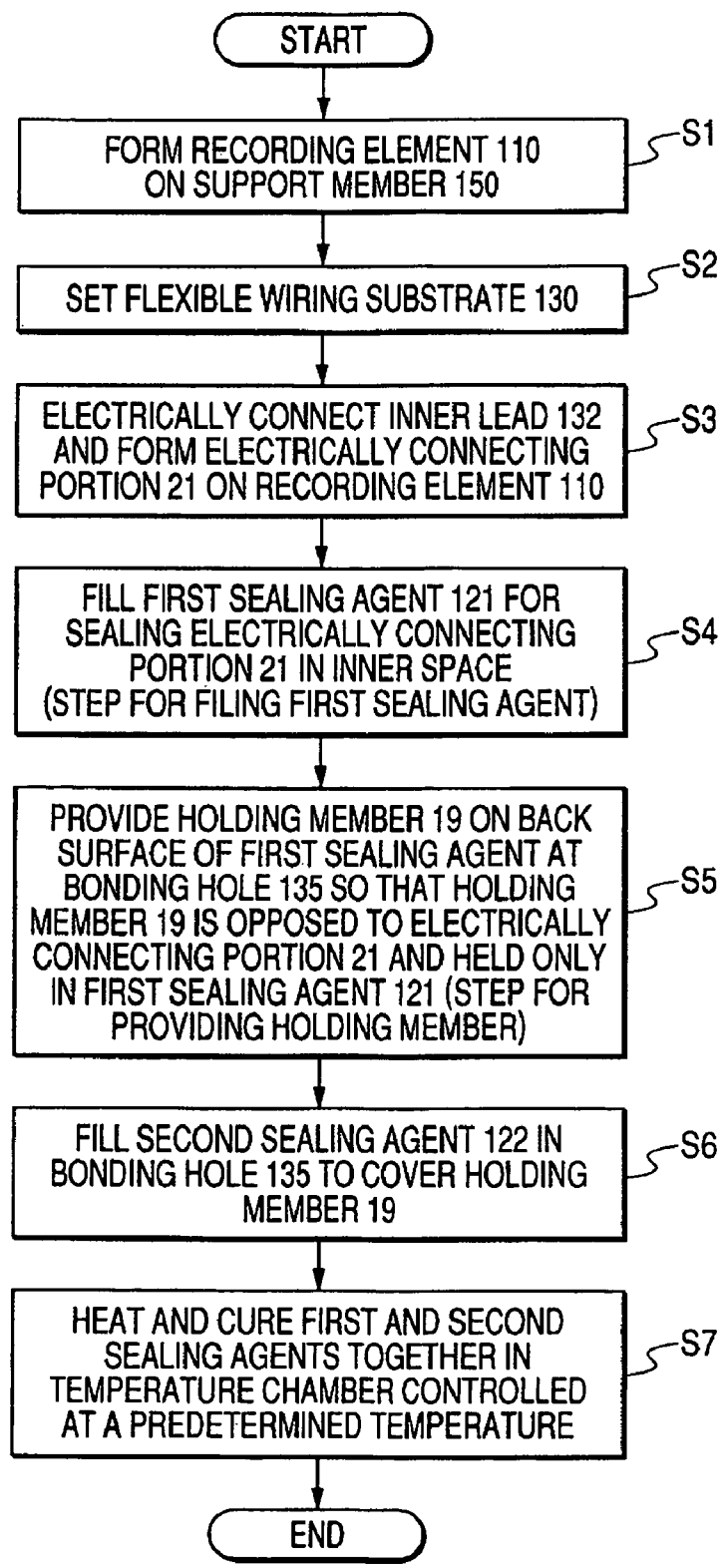
FIG. 12 is a schematic flow diagram showing a method of manufacturing an ink jet recording head shown in FIG. 11.

A more specific method of filling the sealing agent is indicated in the process in which S5 of FIG. 12 is omitted from the fifth embodiment to be hereinafter described, and in which S6 of FIG. 12 is "fill the bonding hole 135 with the second sealing agent 122".

In the present embodiment, the width W1 of the bonding hole 135 is smaller than the width W3 of the device hole 134, and smaller than the width W2 of the recording element 110. Thus, the gap at the ends on both sides of the bonding hole 135 is formed to be narrow, and the sealing agent applied from above the inner lead 132 is suppressed from dropping in the direction of both sides of the recording element 110 from the gap at the ends on both sides.

By having the width W1 of the bonding hole 135 narrower than the width of the wiping blade (not shown) used in cleaning the surface formed with the discharge port column 111 of the recording element 110 the wiping blade basically contacts so as to slide over the surface of the base film 137. Thus, the sealing agent in the bonding hole 135 is less likely to contact the wiping blade, and the damage of the sealing agent subjected during wiping is suppressed.

As described above, with regards to the recording head of the present embodiment, by sealing the periphery of the recording element and the electrically connecting portion with one type of sealing agent having satisfactory fluidity, the applicability and adhesiveness of the sealing agent are enhanced, and the material cost is reduced. By lowering the height of the sealing part as described above, the spacing between the recording head and the recording medium conveyed by the conveying means (not shown) so as to face the recording head is reduced, and the recording quality and the like of the recording apparatus is enhanced.

Second Embodiment

Figure 5:
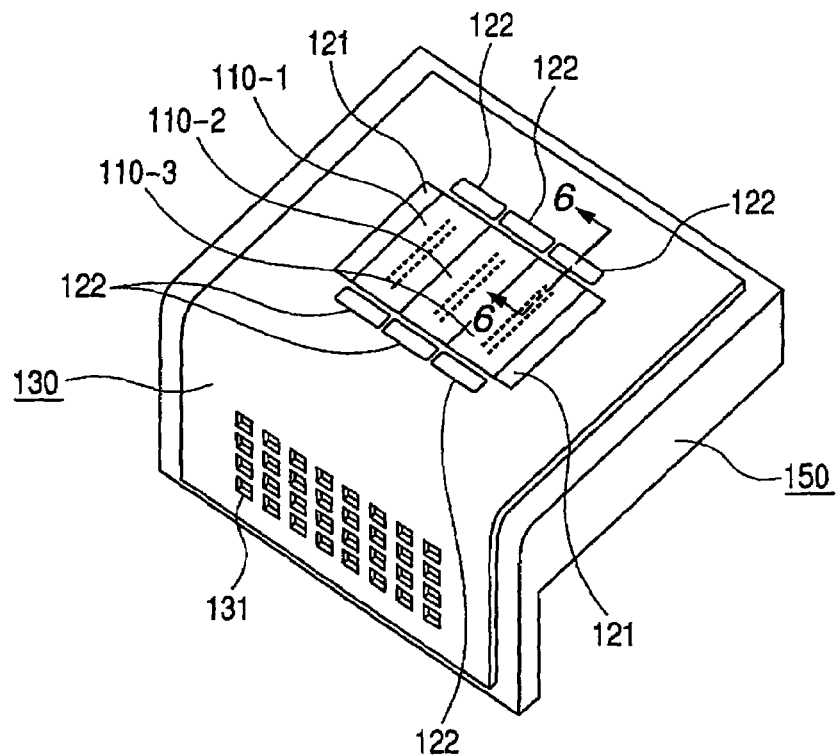
FIG. 5 is an entire perspective view of a recording head according to a second embodiment.
Figure 6:
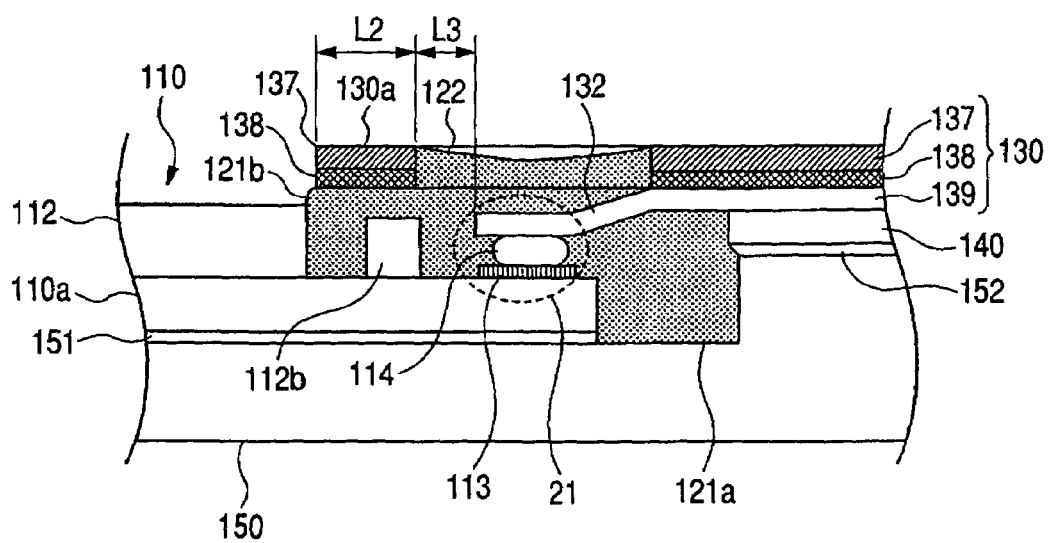
FIG. 6 is a partial cross sectional view taken along line 6-6 of FIG. 5 of the recording head of FIG. 5.

FIG. 5 to FIGS. 7A and 7B show the recording head according to a second embodiment. The following explanation is focused on the difference from the first embodiment. The part not particularly mentioned is the same as the first embodiment. In the present embodiment, as shown in FIG. 6, a rib-shaped protrusion 112a is arranged at a position facing the separating band 130a of the flexible wiring substrate 130 and adjacent to the end of the nozzle plate 112 on the heater board 110a. Thus, a groove 112b extending parallel to the separating band 130a is formed. The groove 112b secures the filling path when one portion 121b of the first sealing agent 121 is filled to between the separating band 130a of the flexible wiring substrate 130 and the recording element 110 by the capillary phenomenon.

Figure 7A:
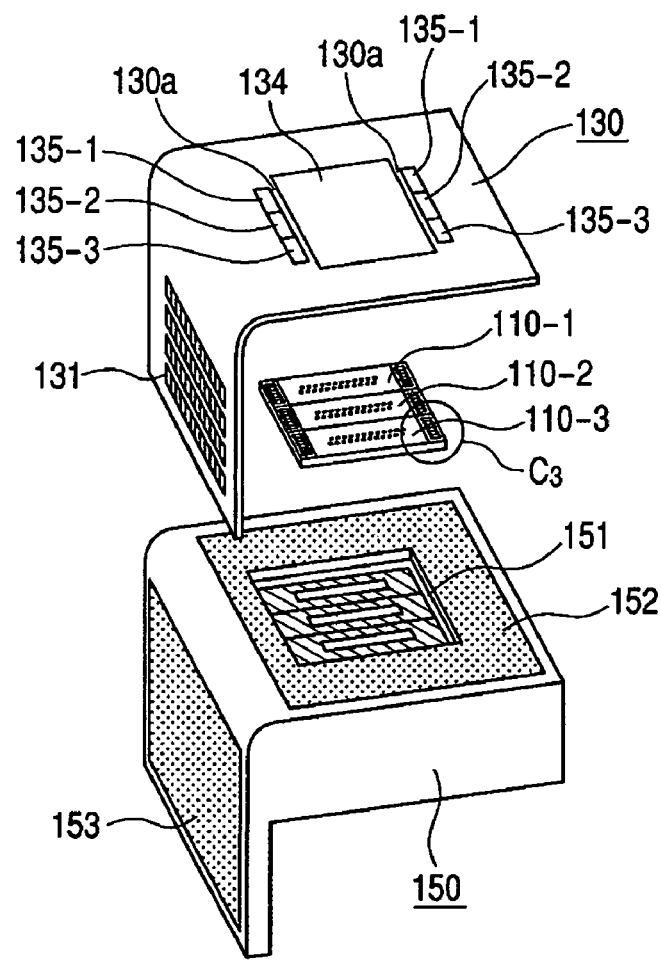
FIGS. 7A and 7B are perspective views showing a state before sealing with the sealing agent of the recording head of FIG. 5, where 7A is the exploded perspective view and 7B is an enlarged partial perspective view of the portion circled with circle C3.
Figure 7B:
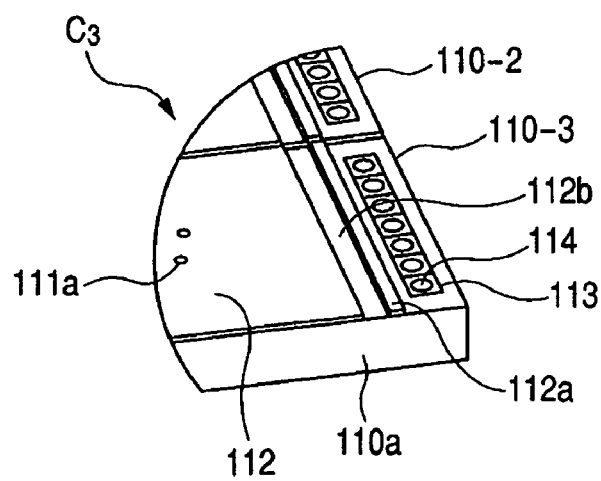

As shown in FIG. 5 and FIGS. 7A and 7B, if it is the recording head capable of discharging inks of three colors, for example, the ink supply path and the discharge port column corresponding to the ink of three colors are arranged. Thus, in order to incorporate the recording elements 110-1, 110-2, 110-3 for three colors, the device hole 134 of the flexible wiring substrate 130 must be greatly opened. In this case, the separating band 130a becomes long and thus is easily deflected, and thus the path for filling the first sealing agent 121 is difficult to secure. However, in the present embodiment, the rigidity of the separating band 130a is enhanced by dividing the bonding hole 135-1, 135-2, 135-3 corresponding to each recording element 110-1, 110-2, 110-3. The rib-shaped protrusion facing the separating band 130a is arranged proximate to the nozzle plate 112. Thus, the groove 112b is formed along the edge of the device hole 134-1, 134-2, 134-3 of the flexible wiring substrate 130, and the filling path of the sealing agent 121 is secured. The assembly procedures of the heater board 110a, the nozzle plate 112, the flexible wiring substrate 130, the supporting member 150 and the like is the same as the first embodiment.

In the recording head of the present embodiment, the groove is arranged along the edge of the device hole of the flexible wiring substrate to secure the filling path of the sealing agent. Thus, even with the recording head in which the length of the separating band is long, the periphery of the recording element and the electrically connecting portion are sealed with one type of sealing agent having satisfactory fluidity. In addition, by lowering the sealing height similarly to the first embodiment, the spacing between the recording head and the recording medium is reduced and the recording quality and the like are enhanced.

Third Embodiment

Figure 8:
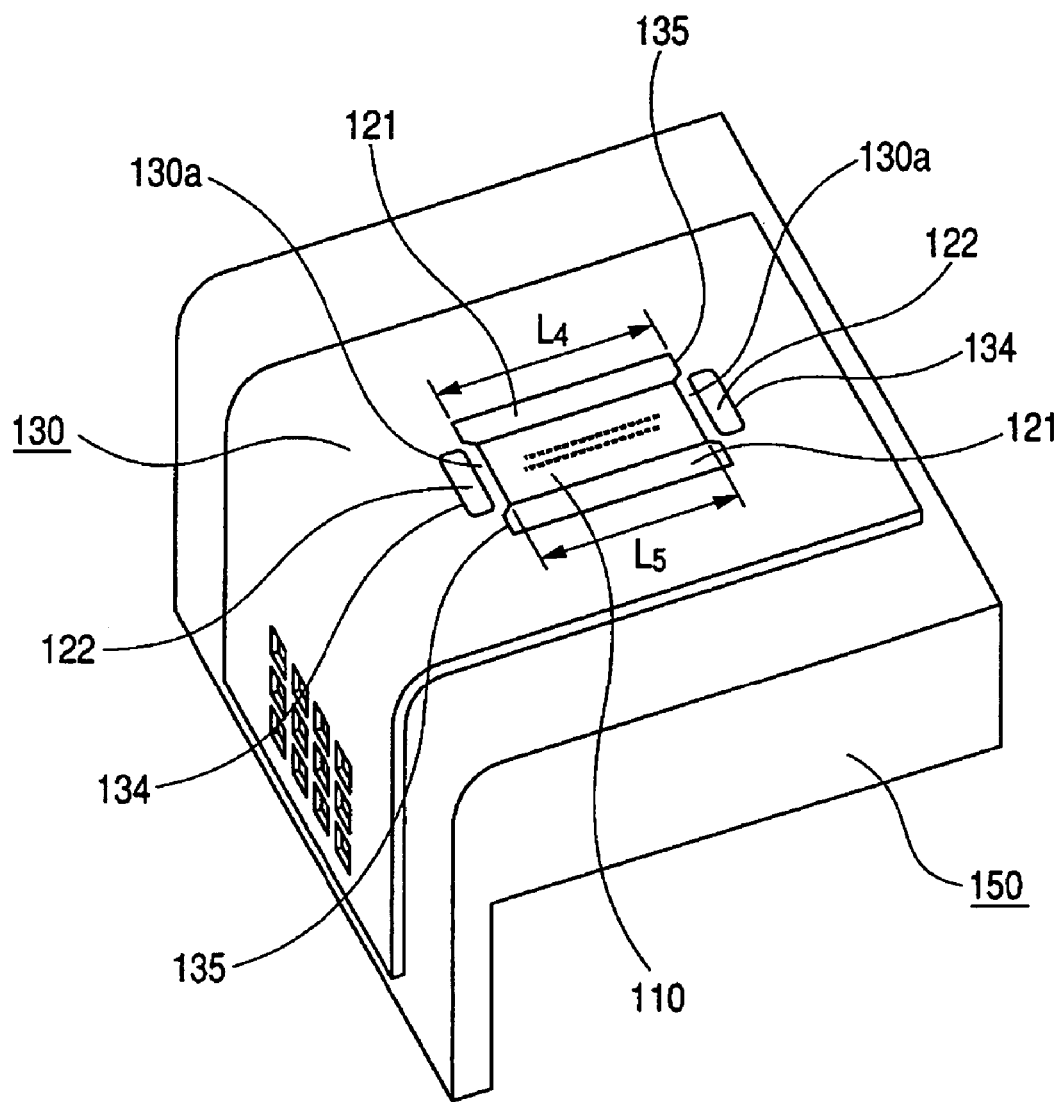
FIG. 8 is an entire perspective view of a recording head according to a third embodiment.
Figure 9A:
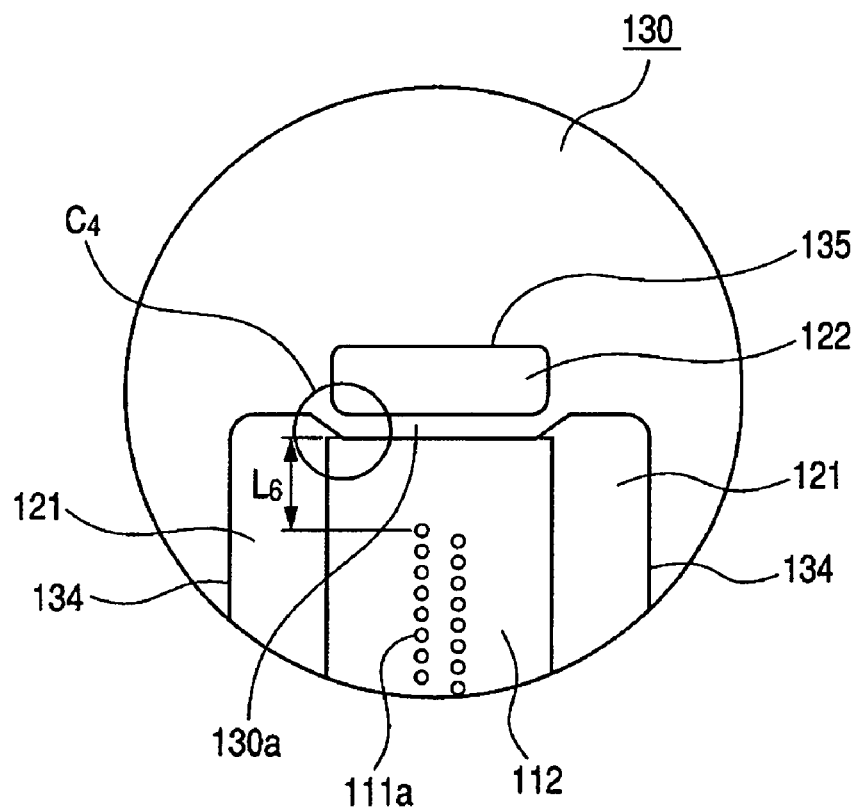
FIGS. 9A and 9B are partial detailed views of the recording head of FIG. 8, where 9A is an enlarged plan view of the sealing part of one end of the recording element, and 9B is an enlarged partial plan view of the portion circled with a circle C4 of 9A.
Figure 9B:
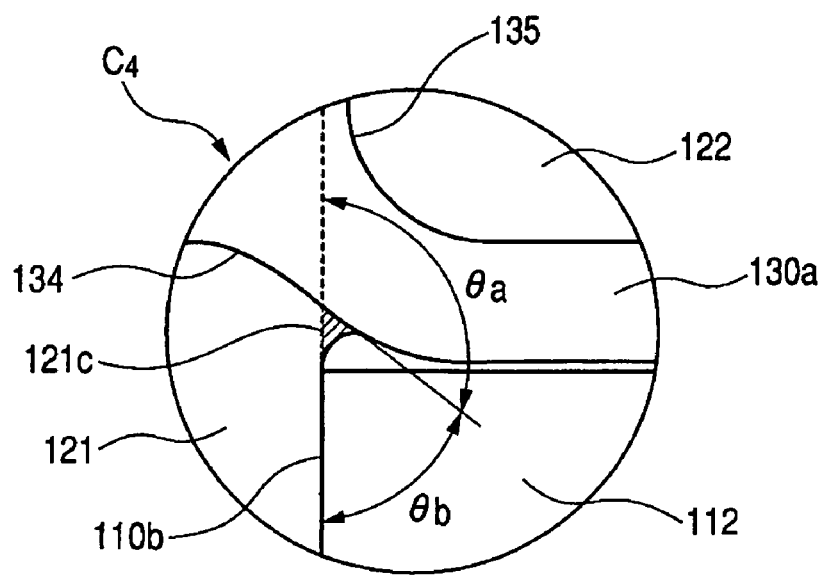

FIG. 8 and FIGS. 9A and 9B show a third embodiment. The following explanation is made focusing on the difference from the first embodiment. The part not particularly mentioned is the same as the first embodiment. The recording head of the present embodiment is configured so that the width of the central part of the device hole 134 of the flexible wiring substrate 130 is narrow. Specifically, the length L5 of the central part of the device hole 134 shown in FIG. 8, for example, is formed to be smaller with respect to the length L4 of the outer peripheral side. That is, as shown in FIG. 9B, the side facing the bonding hole 135 of the device hole 134 is bent in a direction separating away from the recording element 110 near the end. The intersecting angle of the separating band 130a and the side surface 110b of the recording element 110 is $\theta a > \theta b$ where $\theta a$ is the separating band side and $\theta b$ is the first opening side.

The present embodiment has a configuration in which the sealing agent 121 is filled by the capillary phenomenon to a gap between the main surface of the recording element 110 and the separating band 130a of the flexible wiring substrate 130. Thus, there is a possibility that the first sealing agent 121 slightly spreads to the main surface of the recording element 110 at a portion connecting the reservoir part 121c of the sealing agent 121 and the gap below the separating band 130a. With the above-described configuration, the sealing agent riding on the main surface of the recording element 110 is made distant without extending the distance L6 between the discharge port 111a positioned at the end of the discharge port column and the separating band 130a.

That is, if the sealing agent is brought close to the discharge port 111a, the performance of the wiper for wiping the ink attached to the nozzle plate surface may be affected. In the recording head of the present embodiment, the position of the sealing agent to ride on the main surface of the recording element can be separated away from the discharge port 111a. Thus, there is an advantage that the size of the recording element does not need to be enlarged. Other advantages are the same as the first embodiment.

Fourth Embodiment

Figure 10:
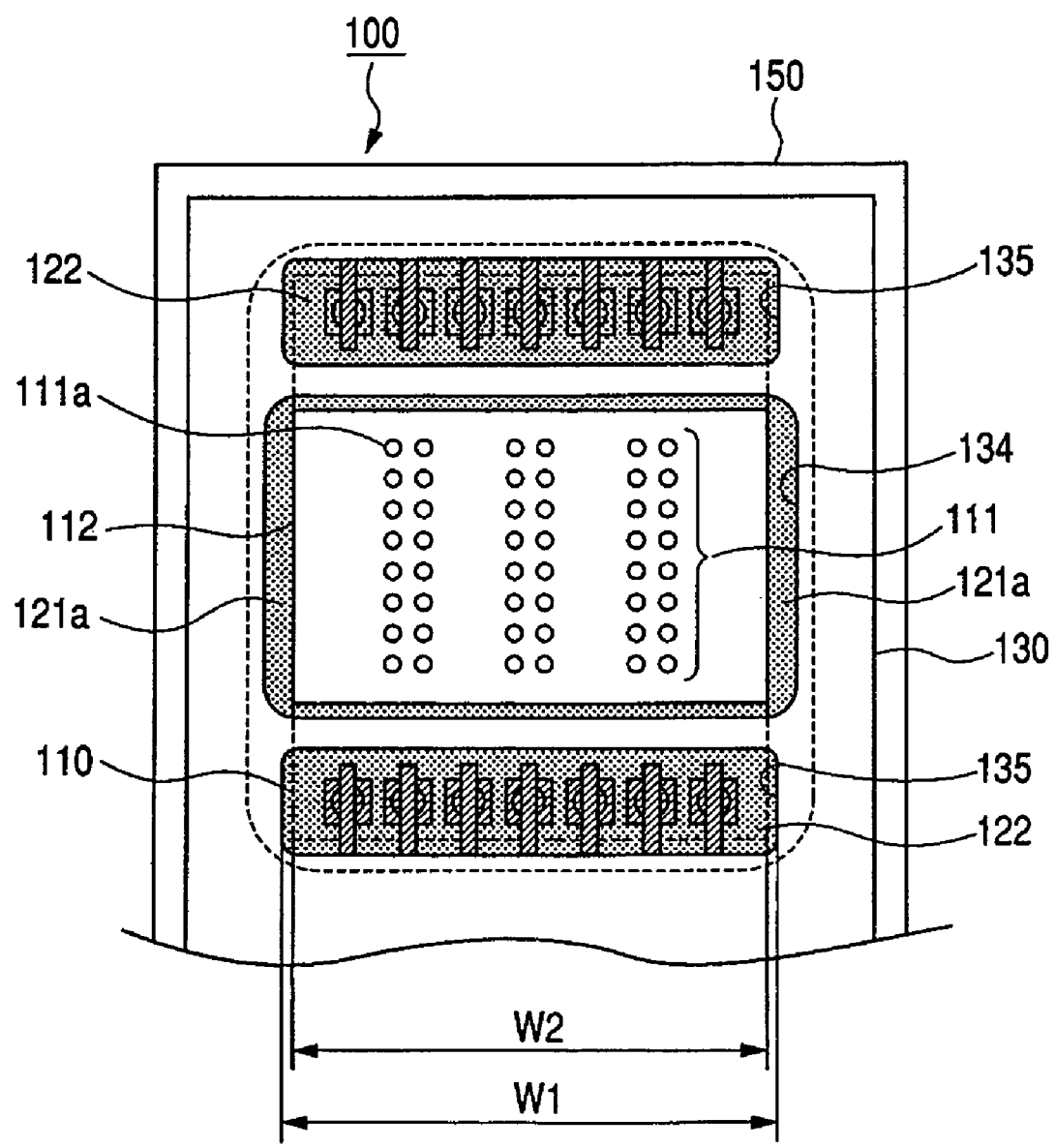
FIG. 10 is a partial plan view of a recording head according to a fourth embodiment.

FIG. 10 is a plane view showing a fourth embodiment. The following explanation is made focusing on the difference from the first embodiment. The part not particularly mentioned is the same as the first embodiment. In the present embodiment, the width W1 of the bonding hole 135 is formed wider than the width W2 of the recording element 110. Other configurations are the same as the first embodiment. According to such configuration, the first sealing agent 121 applied and filled to both sides of the recording element 110 can be filled to the periphery of the bump 114 efficiently and in a short period of time, and productivity is enhanced by reducing the manufacturing time and the like.

Fifth Embodiment

Figure 11A:
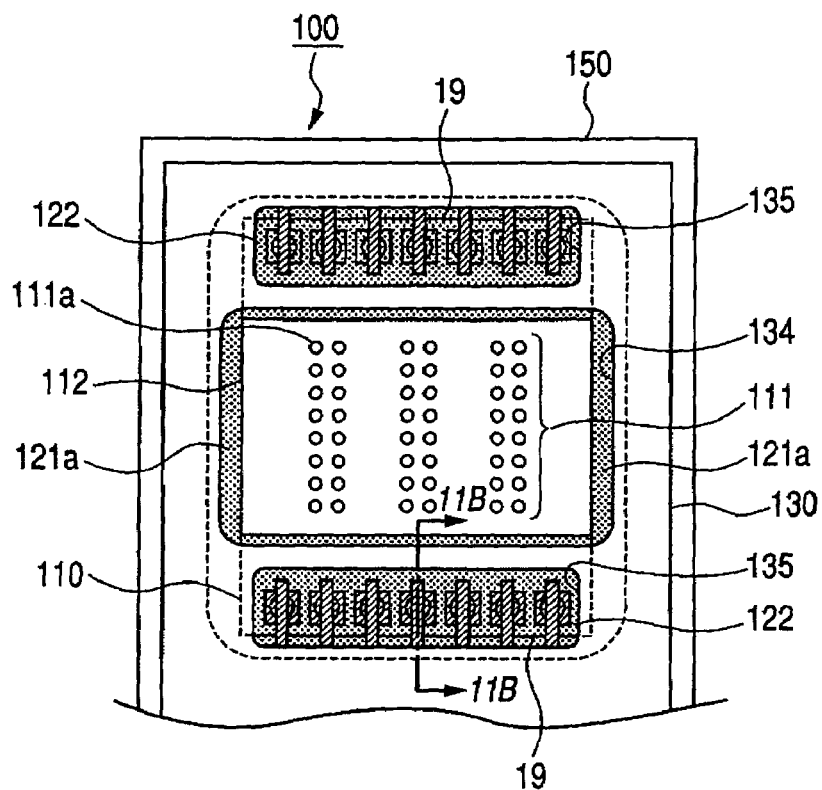
FIGS. 11A and 11B are partial detailed views of a recording head according to a fifth embodiment, where 11A is a partial plan view, and 11B is a partial cross sectional view taken along line 11B-11B of 11A.
Figure 11B:
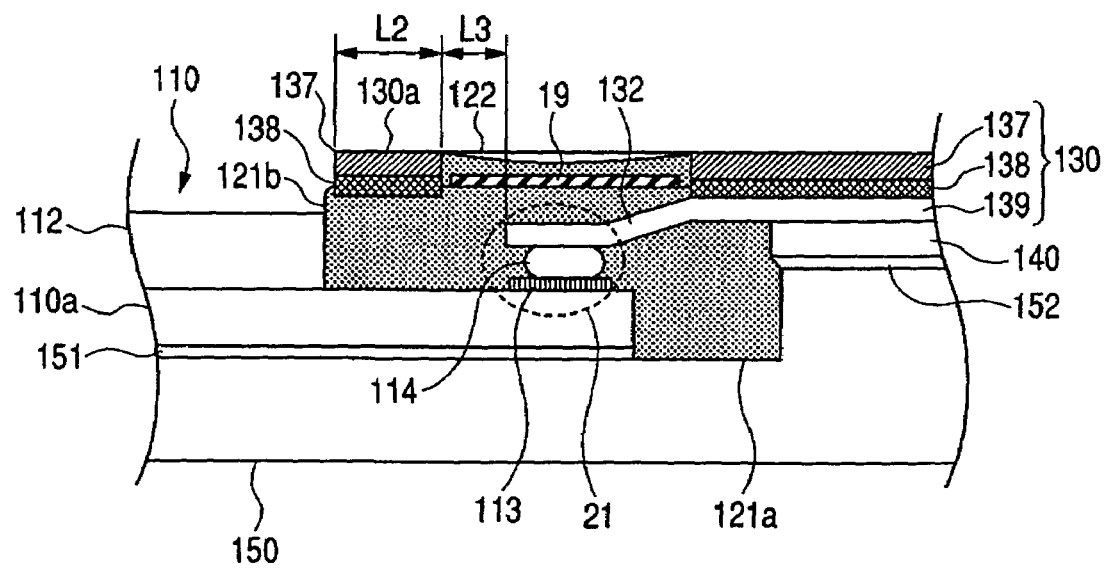

FIGS. 11A and 11B are a plan view and a cross-sectional view showing the fifth embodiment. The following explanation is made focusing on the difference from the first embodiment. The part not particularly mentioned is the same as the first embodiment. A holding member 19 is arranged on the surface of the first sealing agent 121 at the bonding hole 135 at a position facing the electrically connecting portion 21. The holding member 19 is fixed only to the first sealing agent 121. The second sealing agent 122 is formed on the holding member 19. The surface of the second sealing agent 122 is recessed inward with respect to the outer surface of the base film 137, and the extension of the recording element 110 side of the second sealing agent 122 is determined by the base film 137.

A method of manufacturing the recording head 100 described above will now be explained with reference to FIG. 12. FIG. 12 is a schematic flow diagram, showing the method of manufacturing the recording head of the present embodiment.

(Step S1) The recording element 110 is formed on the supporting member 150. Specifically, the adhesive 16 is applied on the supporting member 150, and the heater board 110a is adhered thereto. The nozzle plate 112 is then formed thereon. The nozzle plate 112 is formed by forming the resin acting as the ink flow path on the heater board 110a, and forming the structure of nozzle plate thereon and dissolving the resin.

(Step S2) The flexible wiring substrate 130 is set so as to cover the supporting member 150 and the recording element 110. A plurality of inner leads 132 and the bump 114 joined to the electrode part 113 of the recording element 110 are positioned so as to overlap each other. The flexible wiring substrate 130 is adhered and fixed to the supporting member 150 by way of the adhesive 152 and the resist layer 140.

(Step S3) After aligning the flexible wiring substrate 130, the inner lead 132 is electrically connected to the electrode part 113 to form the electrically connecting portion 21 on the recording element 110.

(Step S4) The first sealing agent 121 is filled to the periphery of the recording element 110 (step for filling first sealing agent). The first sealing agent 121 is first injected from the device hole 134, and is gradually spread along the periphery of the recording element 110 at the side faces of both sides of the recording element 110. The first sealing agent 121 is further penetrated to the lower space of the bonding hole 135 to fill the entire region of the periphery of the recording element 110. The first sealing agent 121 is conveyed over the lower surface of the base film 137 by the capillary force with the base film 137 to cover the bump 114. Subsequently, the first sealing agent 121 is further filled from the upper part of the bonding hole 135 to cover the entire region of the upper surface of the inner lead 132. The application amount is adjusted and managed so that the first sealing agent 121 does not expand from the side surface of both sides of the recording element 110 or overspill and flow out to the discharge port surface (surface of the recording element 110 formed with a plurality of discharge ports) which is the surface of the nozzle plate 112. The first sealing agent 121 is preferably filled to the inside of the bonding hole 135. After the present step and before the next step, the first sealing agent 121 may be subjected to a pre-cure step to be in a half-cured state.

(Step S5) The holding member 19 is arranged on the surface of the first sealing agent 121 filled in the bonding hole 135 so as to face the electrically connecting portion 21 and to be held only by the first sealing agent 121 (step for providing holding member). "Held only by the first sealing agent 121" means that it is not held by other supporting structures, and is simply floated on the surface of fluid resin before curing. The holding member 19 holds the first sealing agent 121 applied to the arrangement region of the inner lead 132 during curing and has a function of strengthening the sealing part after curing. The holding member 19 is arranged so as to cover the entire region of the arrangement region of the inner lead 132 and so as not to protrude out from the surface on the outer side of the flexible wiring substrate 130. The holding member 19 may be a plate shape (film etc.) member as long as it is a material having electrical insulation and being hydrophilic with the sealing agent, or may be fibrous that allows the sealing agent to be infiltrated.

Before the step for providing the holding member, surface improving process to provide hydrophilic property with respect to the first sealing agent 121 may be performed on the holding member 19. If hydrophilic property is enhanced by performing surface treatment such as plasma process on the holding member 19, more satisfactory sealing state is obtained. In one embodiment, the polysulfone film having a thickness of 0.03 mm is fabricated to a desired shape for the holding member 19 and is subjected with normal pressure plasma process.

(Step S6) The second sealing agent 122 is filled into the bonding hole 135 to cover the holding member 19 (therefore, so as not to expose the upper surface of the inner lead 132). Here, the second sealing agent 122 is preferably held at the peripheral edge of the opening of the bonding hole 135, and the filling amount is preferably adjusted so as to become a recessed shape towards the inner side of the bonding hole 135. Thus, the second sealing agent 122 is prevented from flowing out from the upper surface side of the base film 137 to the discharge port surface, and the sealing state in which the discharge port surface is not expanded is obtained. The second sealing agent 122 covers the inner lead region so as to encapsulate the holding member 19 and thus has an advantage of reinforcing the covered part.

(Step S7) The first and the second sealing agents 121, 122 are heated and cured all together in a constant temperature bath (oven etc.) managed to a predetermined temperature. The sealing agents 121, 122 are heated and temporarily softened, but does not flow out to the surrounding since they are attracted to the holding member 19, and are cured while substantially maintaining the state immediately after application.

In the method of manufacturing explained above, the holding member 19 is arranged on the first sealing agent 121, and the second sealing agent 122 is arranged for sealing, but the application of the second sealing agent 122 may be omitted. In this case, the above step S6 may be omitted.

Sixth Embodiment

Figure 13:
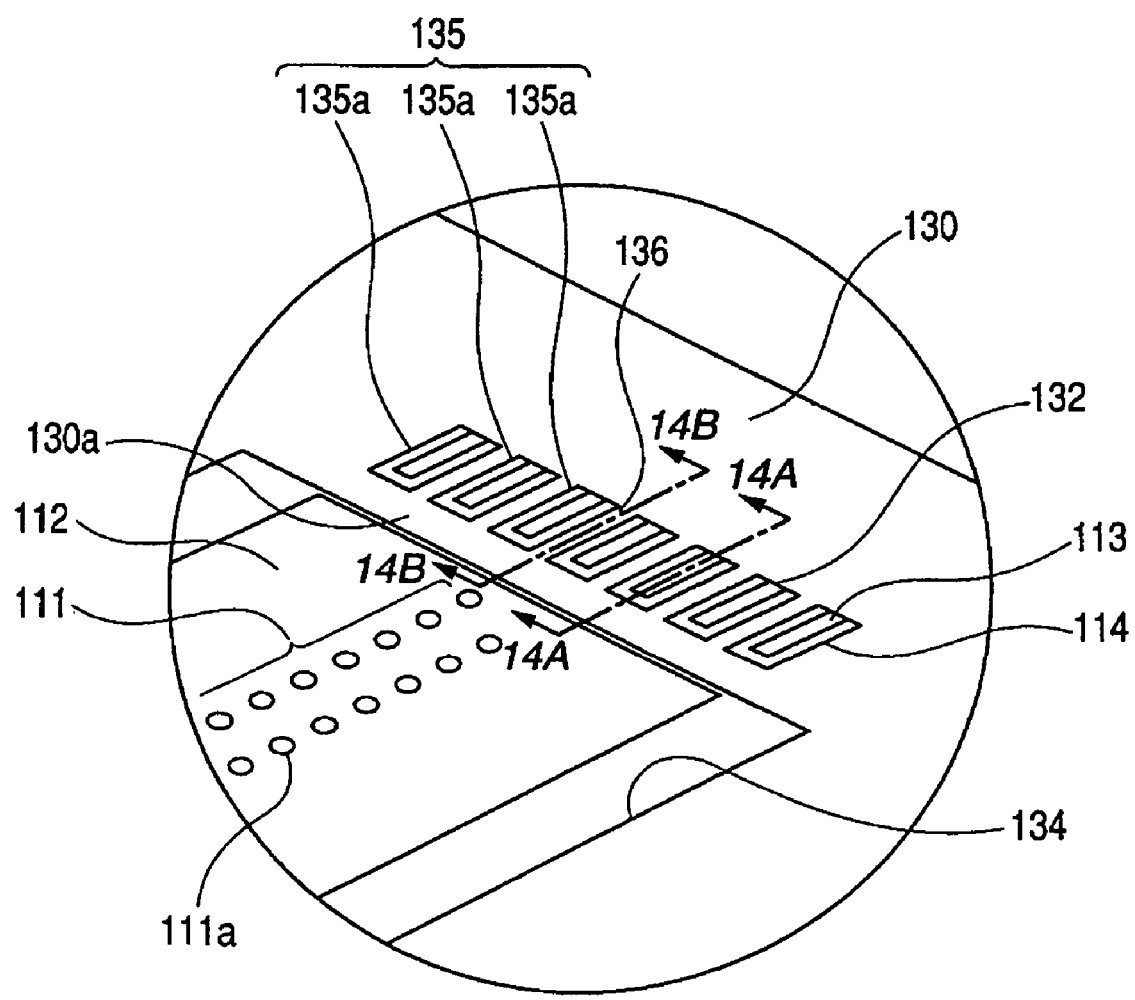
FIG. 13 is a partial perspective view of a recording head according to a sixth embodiment.
Figure 14A:
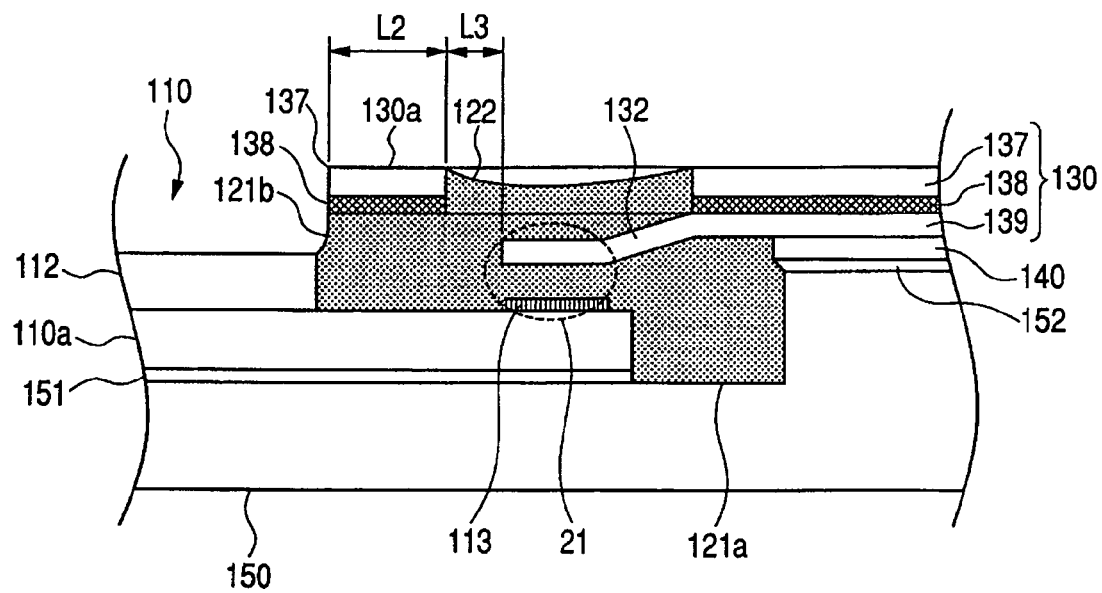
FIGS. 14A and 14B are partial cross sectional views of the recording head of FIG. 13, where 14A is a partial cross sectional view taken along line 14A-14A of FIG. 13, and 14B is a partial cross sectional view taken along line 14B-14B of FIG. 13.
Figure 14B:
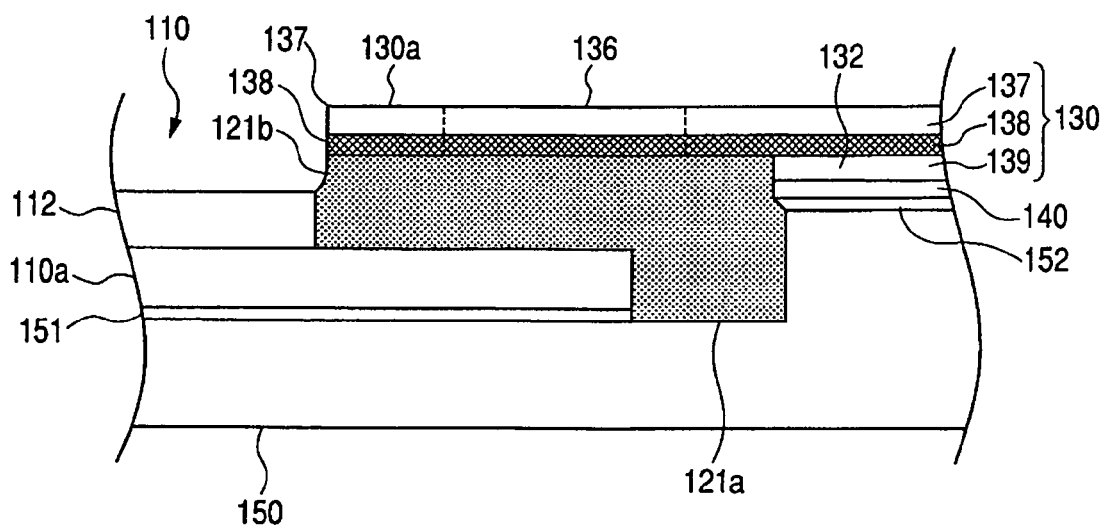

FIG. 13 and FIGS. 14A and 14B show a sixth embodiment. FIG. 14A is a cross sectional view taken along line 14A-14A of FIG. 13, and FIG. 14B is a cross sectional view taken along line 14B-14B of FIG. 13. The following explanation is made focusing on the difference from the first embodiment. The part not particularly mentioned is the same as the first embodiment.

The present embodiment is characterized in that a film member 136 extending between the inner leads 132 is arranged in the bonding hole 135. The film member 136 is formed as a portion of the base film 137. That is, the film member 136 is arranged at a substantially same layer position as the base film 137 configuring the flexible wiring substrate 130. The film member 136 is formed so that the position, facing each electrode part 113, more specifically, the position facing the portion where the electrode part 113 and the inner lead 132 connect, is opened. The film member 136 is extended so as to connect the side of the inner lead 132 with the opposing side of the bonding hole 135. As a result, the bonding hole 135 is formed as a collectivity of a plurality of small openings corresponding to each electrode part 113 of the recording element 110.

The width L2 of the separating band 130a is preferably as narrow as possible since the size of the corresponding recording element 110 becomes larger as the width becomes wider. In the present embodiment, the width L2 of the separating band 130a is for example, 0.35 mm in consideration of the fabricating precision of the die for punching the opening 134 and the material property of the base film 137 and the fabricating precision of the small opening 135a by the excimer laser. The opening width of the small opening 135a is 0.15 mm with respect to 0.05 mm for the width of the inner lead 132. The distance L3 from the separating band 130a to the distal end of the inner lead 132 is also as narrow as possible to reduce the size of the corresponding recording element 110. In the present embodiment, the distance L3 is 0.05 mm in consideration of the fabricating precision of the TAB tape.

The second sealing agent 122 is filled into the bonding hole 135 of dam shape to seal the electrically connecting portion 21. The second sealing agent 122 is filled to a dam shape having a depth of for example, 0.1 mm, and thus similarly to the first sealing agent 121, those having low initial viscosity and satisfactory leveling is used. Therefore, the height of the second sealing agent 122 is made substantially the same as the surface of the base film 137 of the electric wiring substrate 130. The small opening 135a arranged facing each inner lead 132 prevents lowering of liquid level position of the sealing agents 121, 122 by the viscosity change due to thermal curing by the meniscus holding force, and prevents exposure of the inner lead 132. Further, since the film member 136 is arranged, it is less likely to be subjected to external force. For example, as to the wiping mechanism equipped in the main body of the recording apparatus, the external force applied by the wiper blade during contact is reduced, thus the second sealing agent 122 is protected.

Figure 15:
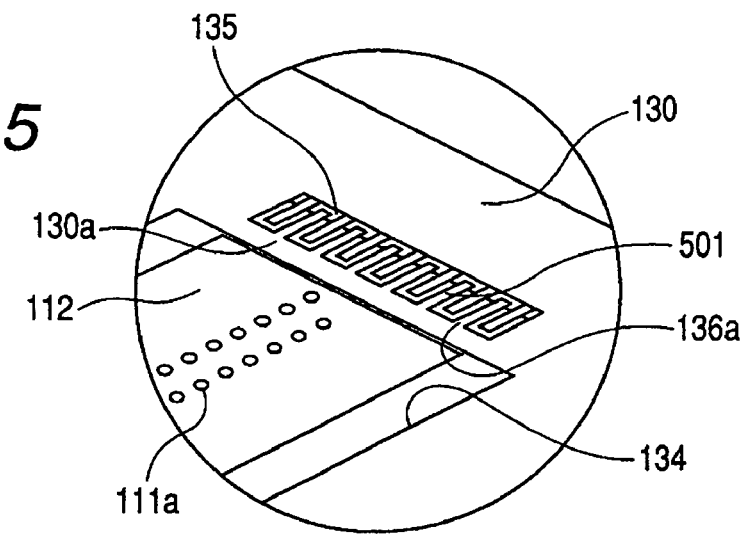
FIG. 15 is a partial perspective view showing another variant of the recording head according to the sixth embodiment.
Figure 16:
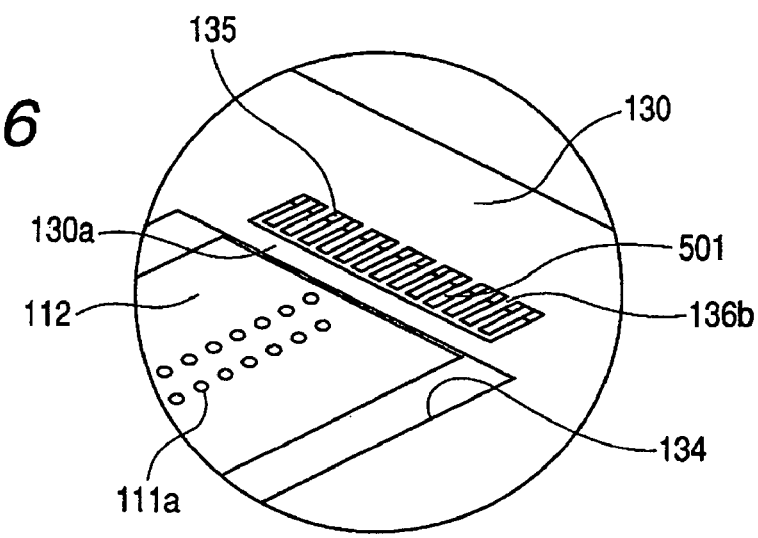
FIG. 16 is a partial perspective view showing another variant of the recording head according to the sixth embodiment.

The film member 136 may be arranged so as not to completely traverse the bonding hole 135. For example, as shown in FIG. 15, the film member 136a is extended from the separating band 130a, and terminates at the middle of the bonding hole 135. Similarly, as shown in FIG. 16, the film member 136b is extended from the surface side arranged with the inner lead 132 towards the separating band 130a, and terminates at the middle of the bonding hole 135. Similar effects are obtained in such variants.

Seventh Embodiment

Figure 17:
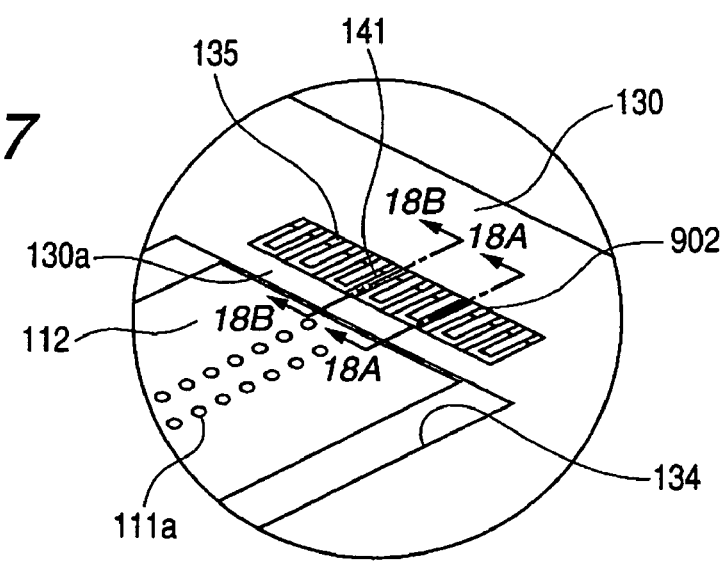
FIG. 17 is a partial perspective view of a recording head according to a seventh embodiment.
Figure 18A:
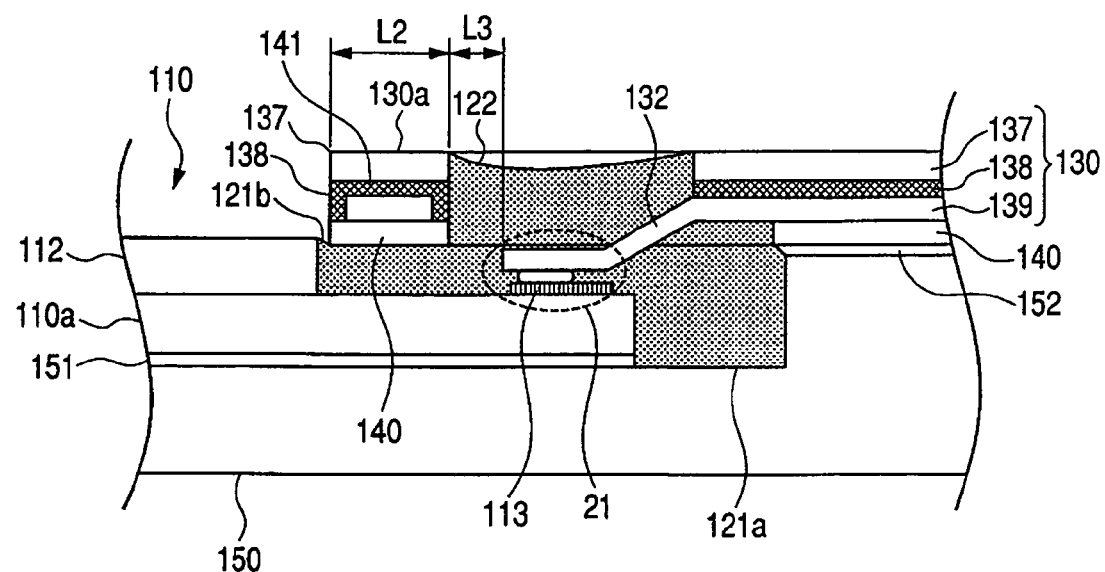
FIGS. 18A and 18B are partial cross sectional views of the recording head of FIG. 17, where 18A is a partial cross sectional view taken along line 18A-18A of FIG. 17, and 18B is a partial cross sectional view taken along line 18B-18B of FIG. 17.
Figure 18B:
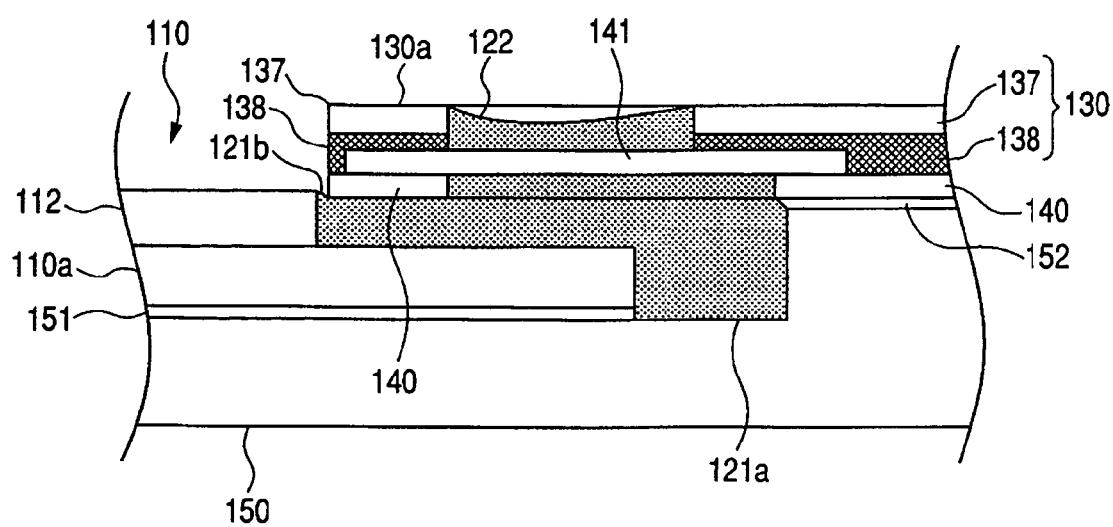

FIG. 17 and FIGS. 18A and 18B show a seventh embodiment. The following explanation is made focusing on the difference from the first embodiment. The part not particularly mentioned is the same as the first embodiment.

The present embodiment is characterized in that the flexible wiring substrate 130 includes a metal pattern member 141 covering a portion of the bonding hole 135. That is, the metal pattern member 141 is arranged at substantially the same layer position as the metal wiring 139 connected to the inner lead 132 and the position facing at least each electrode part 113 is opened. The metal pattern member 141 is extended so as to connect the opposing sides of the bonding hole 135 between the inner leads 132. As a result, similar to the sixth embodiment, the bonding hole 135 is formed as a collectivity of openings 135a.

The metal pattern member 141 is an independent member separated from the wiring 139 for conveying power source, signal and the like for driving the recording element 110. The metal pattern member 141 is formed so as to be branched from a common part arranged at the separating band 130a. By having the metal pattern member 141 as integrated (common) configuration, the increase in number of wirings is minimized, and the enlargement in size of the flexible wiring substrate 130 is suppressed and is advantageous in terms of securing strength of the metal pattern member 141. Further, since the metal pattern member 141 is arranged at the same layer position as the metal wiring 139, the patterning step is simultaneously possible.

The width L2 is preferably as narrow as possible since the size of the corresponding recording element 110 becomes larger as the width becomes wider. In the present embodiment, the width L2 of the separating band 130a is for example, 0.35 mm in consideration of the fabricating precision of the die for punching the openings 134, 135 and the rigidity of the base film 137. The distance L3 from the separating band 130a to the distal end of the inner lead 132 is also as narrow as possible to reduce the size of the corresponding recording element 110. In the present embodiment, the distance L3 is 0.1 mm in consideration of the fabricating precision of the TAB tape.

Figure 19:
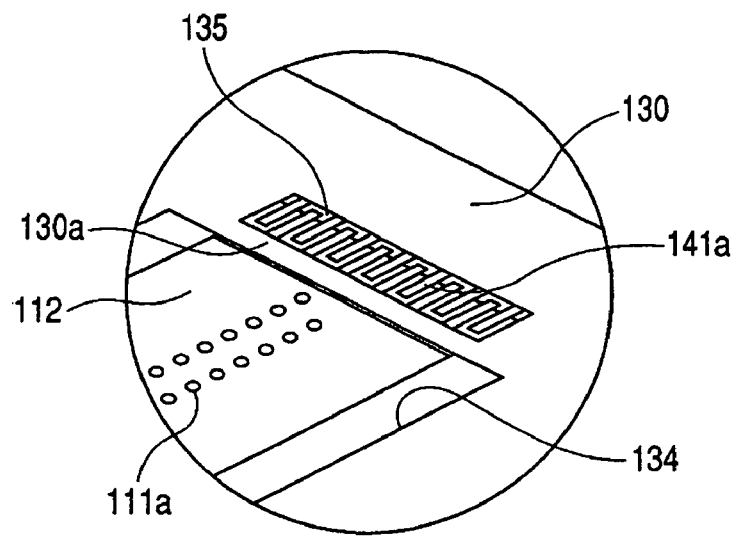
FIG. 19 is a partial perspective view showing another variant of the recording head according to the seventh embodiment.

The metal pattern member 141 may be arranged so as not to completely traverse the bonding hole 135. For example, as shown in FIG. 19, the metal pattern member 141a may be extended from the separating band 130a, and terminated at the middle of the bonding hole 135. Similar effects are obtained in the variants.

Eighth Embodiment

Figure 20:
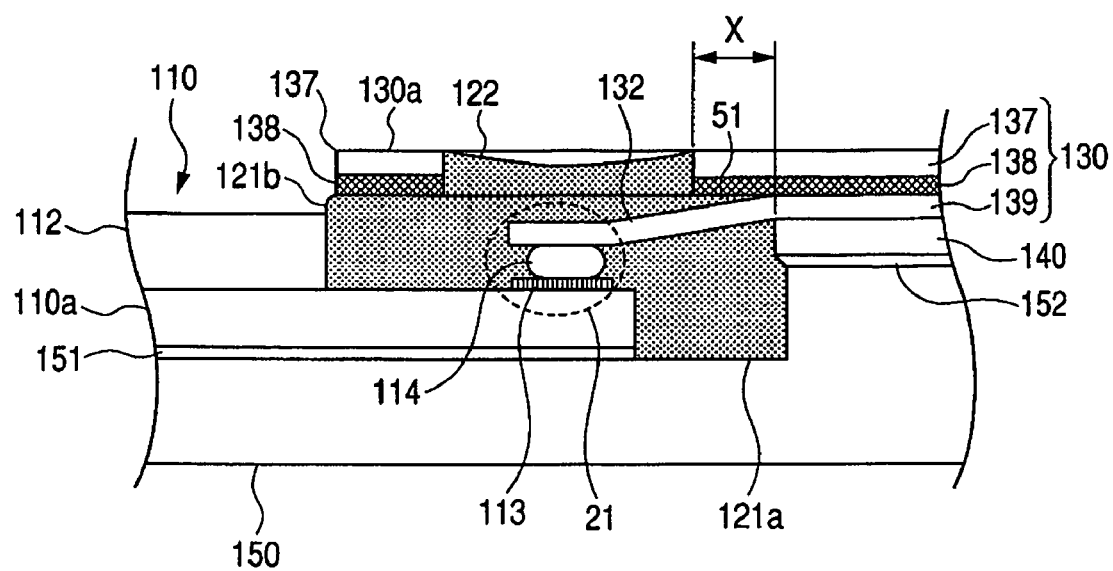
FIG. 20 is a partial cross sectional view of a recording head according to the eighth embodiment.
Figure 21:
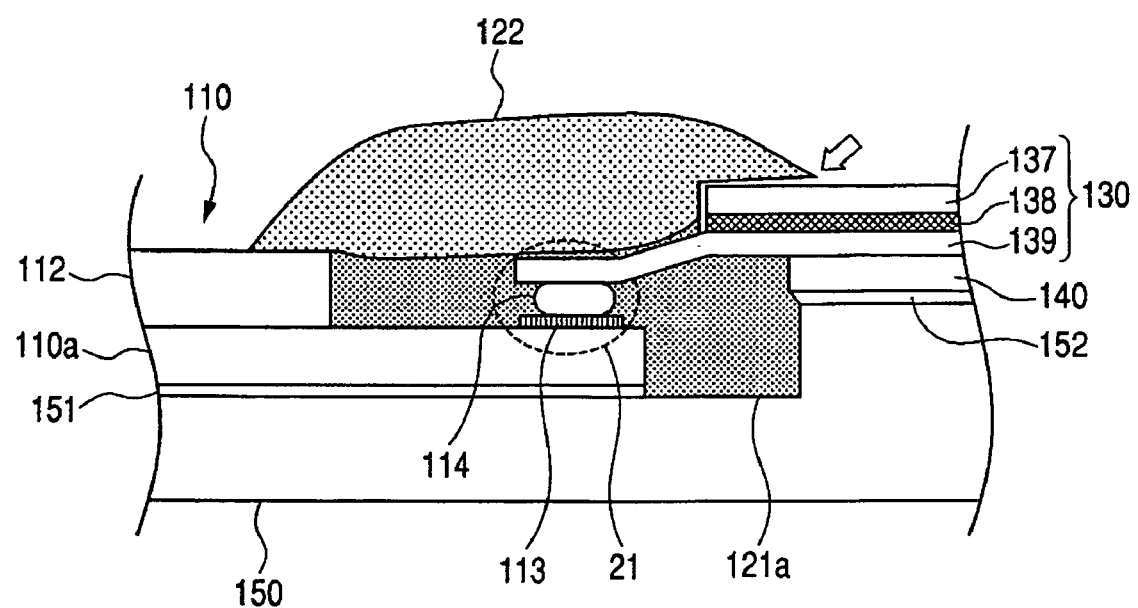
FIG. 21 is a partial cross sectional view of a recording head showing the problems of the prior art.
Figure 22A:
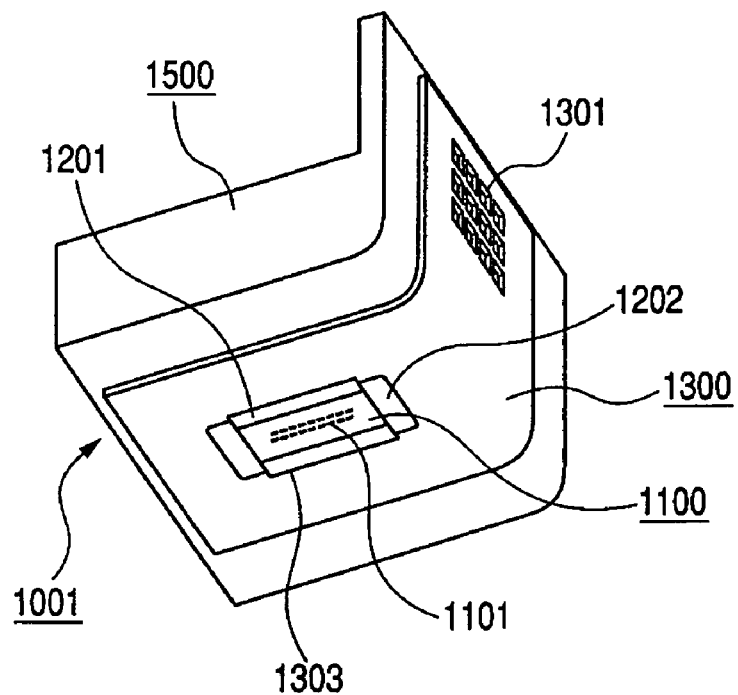
FIGS. 22A and 22B are perspective views showing a recording head of prior art.
Figure 22B:
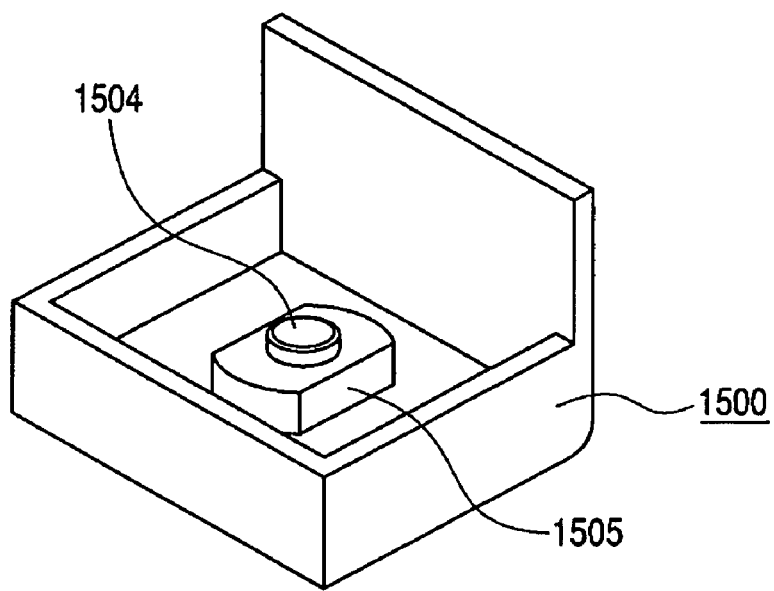
Figure 23:
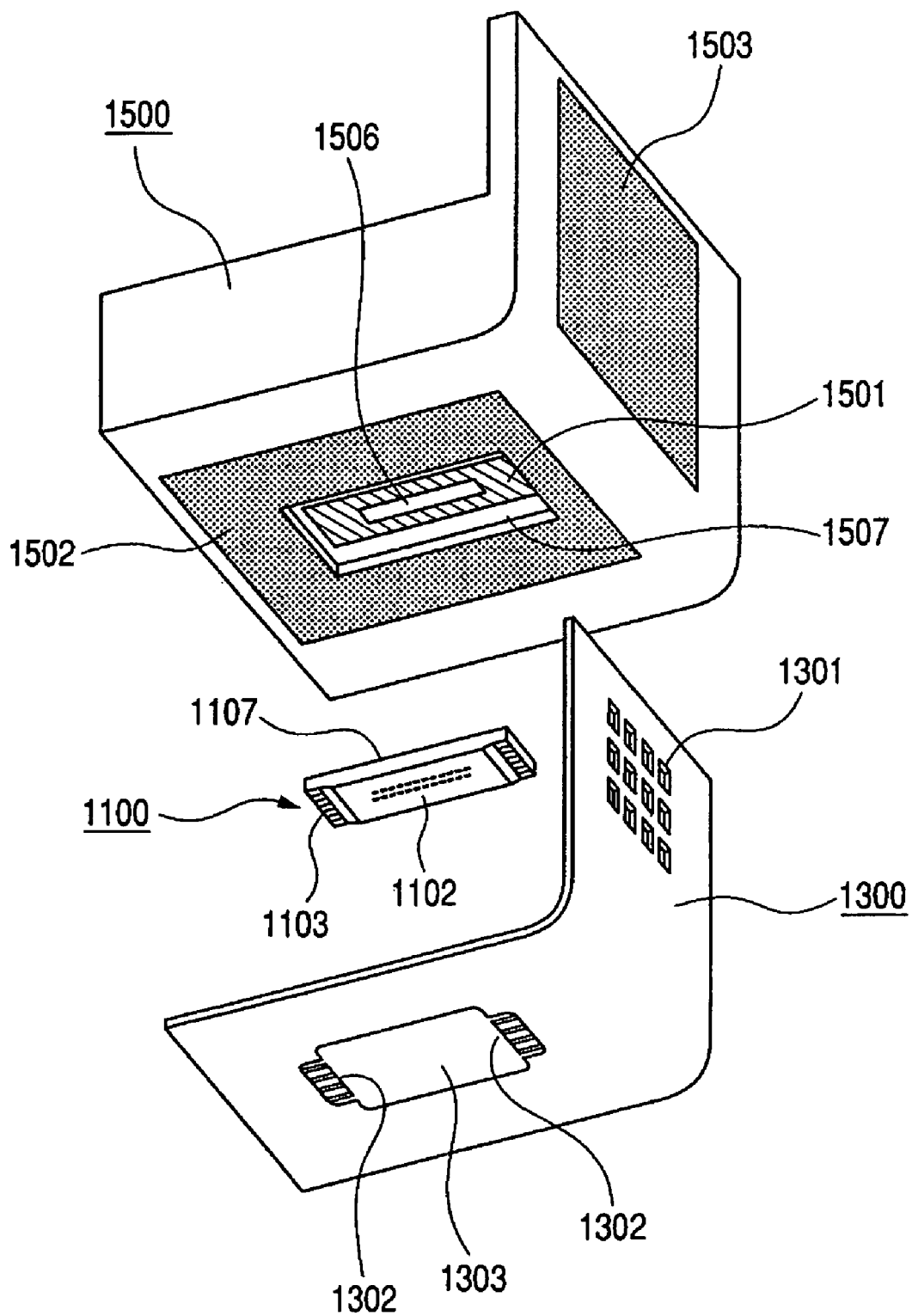
FIG. 23 is an exploded perspective view of the recording head of FIG. 22.
Figure 24A:
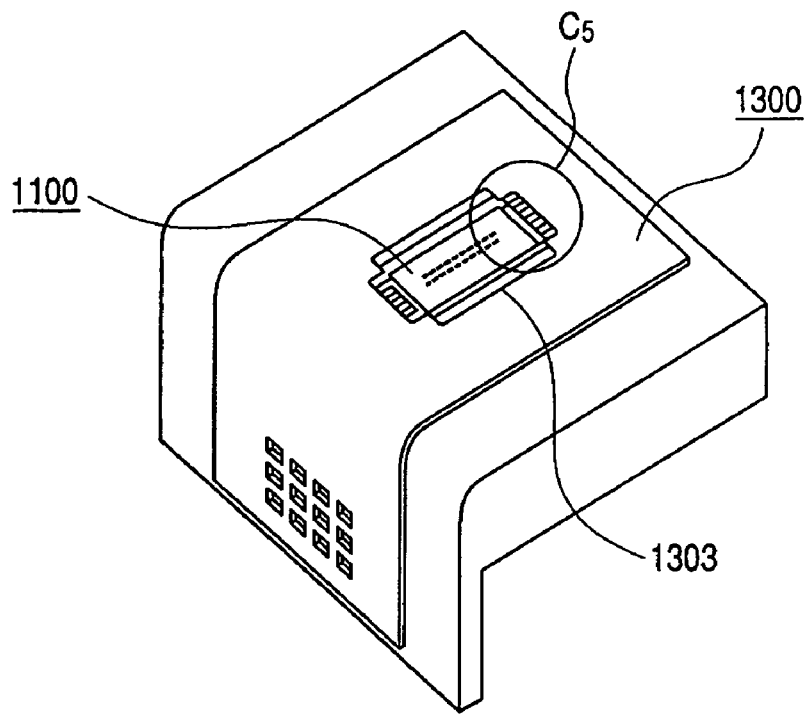
FIGS. 24A and 24B are perspective views showing the state of the recording head of FIGS. 22A and 22B before sealing, where 24A is a perspective view, and 24B is an enlarged partial perspective view of a portion circled by a circle C5.
Figure 24B:
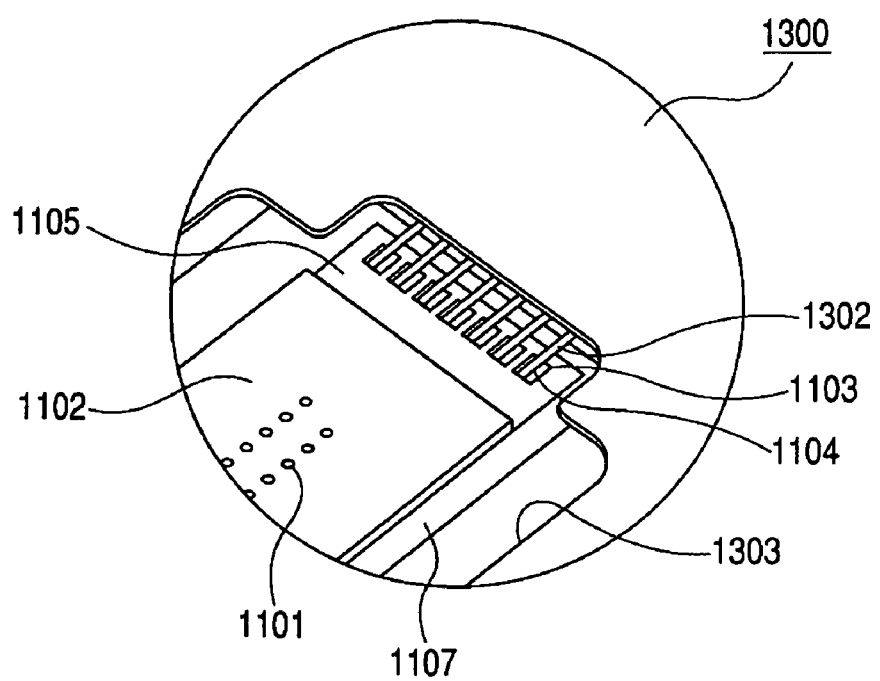
Figure 25A:
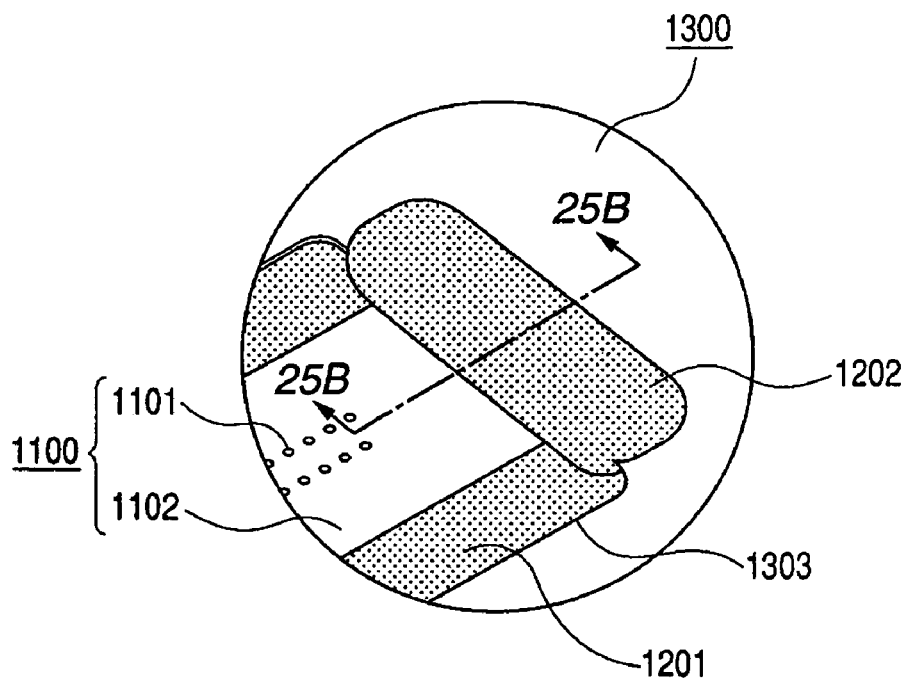
FIGS. 25A and 25B are partially detailed views of a sealing part of the recording head of FIGS. 22A and 22B, where 25A is an enlarged partial perspective view of the sealing part of one end of the recording element, and 25B is a partial cross sectional view taken along line 25B-25B of FIG. 25A.
Figure 25B:
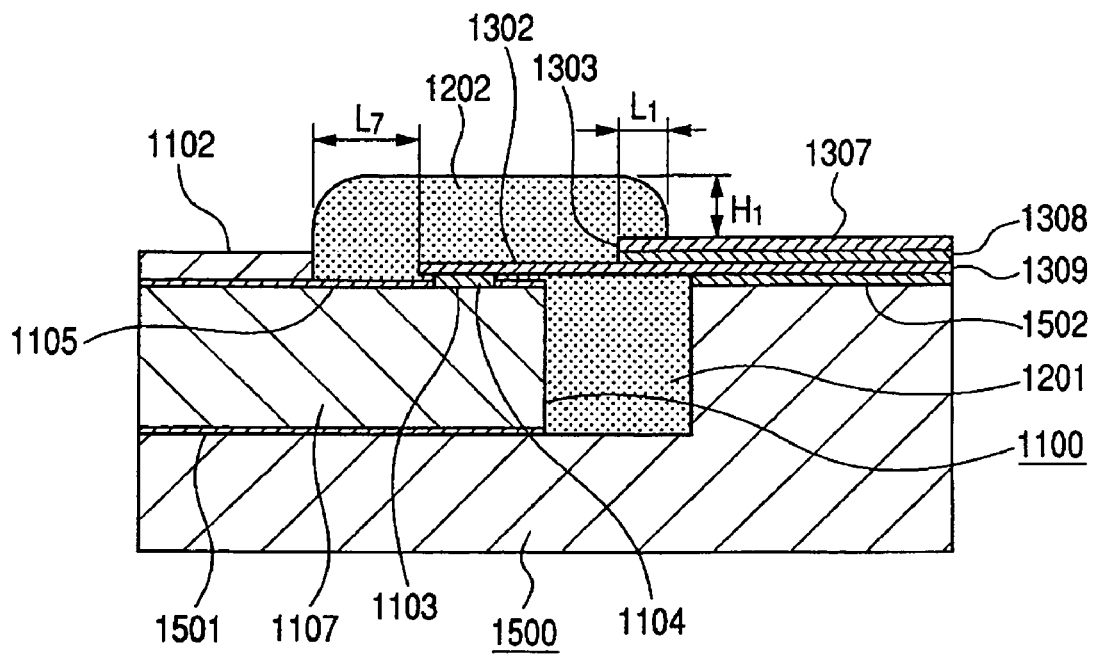

FIG. 20 shows an eighth embodiment. The following explanation is made focusing on the difference from the first embodiment. The part not particularly mentioned is the same as the first, embodiment. The present embodiment is characterized in that the inner lead is separated from the main body of the flexible wiring substrate 130 in a range from the position farther than the rim of the bonding hole when seen from the electrically connecting portion to the electrically connecting portion. The main body is the planar portion of the flexible wiring substrate 130 formed with the base film 137, the metal wiring 139 and the like. The present embodiment aims to solve the following problems in addition to the above problems. Generally, the sealing agent having high thixotropy is very hard, and often has small thermal expansion coefficient. Thus, a stripping force is always applied to the adhering boundary with the base film 137 having large thermal expansion coefficient as the second sealing agent 122 cannot follow the reduction of the base film 137. In addition, since polyimide is used for the base film 137, which material having difficult adhesiveness, the stripping force is applied to the location where adhesive force is weak. Thus, the force exceeding the adhesive force is easily applied by for example, sudden temperature change or impact by dropping and the like, and may cause stripping at the adhesive boundary (refer to outlined arrow) as shown in FIG. 21. When such stripping occurs, particularly, when using liquid such as ink as in the ink jet recording head, the ink passes through the gap formed by stripping and may reach the inner lead. Consequently, electrical short occurs between the adjacent inner leads and the normal image recording may not be performed, and in the worst case, the recording head may break.

In the present embodiment, the originating position (adhering end with the lower surface of the base film) acting as the separating lead in which the inner lead 132 is stripped from the base film 137 of the flexible wiring substrate 130 is shifted by distance X to the position farther than the opening rim of the bonding hole 135 when seen from the electrically connecting portion 21, that is, to the opposite side of the opening. Thus, a region (gap 51) is formed between the inner lead 132 and the base film 137 where the two do not adhere, and the first sealing agent 121 is also filled into the gap 51. Assuming the second sealing agent 122 is stripped in the bonding hole 135 and the ink flows in from the stripped part, the ink is considered to follow the path that passes from the stripped part through the lower surface of the base film 137 and reaching the inner lead 132. However, since the stripped part and the inner lead 132 is separated by the distance X, the path until the ink reaches the inner lead 132 becomes longer by such amount. Thus, even if the second sealing agent 122 is stripped by any possibility, it becomes difficult for the ink to reach the inner lead 132, and the ink jet recording head of high reliability is provided.

A method of forming the gap 51 by shifting the originating position in which the inner lead 132 becomes the separating lead will now be explained. First, in the manufacturing process of the flexible film wiring substrate 130, a plurality of sprocket holes (not shown) are punched in the press step by the die into the base film 137 on which the adhesive for adhering the copper foil to be the lead electrode is applied throughout. The device hole 184 and the bonding hole 135 are punched all together or individually with the sprocket hole as the reference.

After removing the adhesive or eliminating adhesive force by irradiating the laser tight on the region where the inner lead 132 is not desired to be adhered, copper foil is laminated. The resist is applied to the copper foil, and then patterned to obtain a desired pattern and then the copper is etched. The unnecessary resist used in patterning is removed, and finally, the wiring protective layer (insulation film, resist etc.) is provided.

Alternatively, after punching the device hole 134 and the bonding hole 135 all together or individually, the copper foil may be immediately laminated. Following thereto, in this case as well, the resist is applied to the copper foil, patterned to obtain a desired pattern, the copper is etched, and the unnecessary resist used in pattering is removed. Thereafter, the formed inner lead 132 is stripped by a predetermined amount, and finally, the wiring protective layer (insulation film, resist etc.) is provided. In this method, it is important that those having a relatively weak adhesive force of the adhesive to be used are selected.

The first sealing agent 121 wraps around the periphery of the recording element 110, and at the same time, a portion thereof is conveyed through the lower surface of the base film 137 of the flexible film wiring substrate 130, and gradually fills the bump 114 and the inner lead 132. The first sealing agent 121 is then filled into the gap 51 between the base film 137 and the inner lead 132 and an equilibrium state is finally maintained.

(Relationship Between the First and Second Sealing Agents 121, 122)

In each embodiment described above, the first and the second sealing agents 121, 122 may be the same sealing agent (resin) or may be sealing agent (resin) of different component as described below. It may be selected depending on the required specification of the ink jet recording head.

First, when using the same sealing agent, only one sealing agent needs to be used for the sealing agent, and thus compared to prior art, the material cost is reduced, and the curing step of the sealing agent is simplified, which contributes to the reduction in cost and improvement in production efficiency. The curing inhibition caused when different types of sealing agents directly contact is suppressed (enhance reliability of cured state), and the reliability of the ink jet recording head is enhanced.

When using different sealing agents, there is an advantage in that the suitable material that individually satisfies the respectively required function can be selected. As one example, the resin having a satisfactory fluidity and having rubber elasticity after curing so as not to damage the recording element 110 due to contraction during curing is used for the first sealing agent 121. The resin having rigidity that withstands friction with the wiping blade of the main body of the recording apparatus is used for the second sealing agent 122. Thus, by individually selecting the suitable material, the reliability of the entire ink jet recording head is enhanced. When using different sealing agents for the first and the second sealing agents 121, 122, it is desirable to select the materials that do not cause curing inhibition with each other or to consider the process that does not cause curing inhibition.

One component heat setting epoxy resin may be used for the first sealing agent 121. The material having high hardness after curing, for example, one-component heat setting epoxy resin may be used for the second sealing agent 122. The curing temperature is preferably set to lower than or equal to the heat resistance temperature of the nozzle plate 112.

(Others)

In the first embodiment the "configuration in which the outer shape of the nozzle plate 112 is greater than the device hole 134 and the nozzle plate 112 and the flexible wiring substrate 130 are planarly overlapping" is shown in FIG. 4C. This configuration suppresses the first sealing agent 121 from diffusing towards the discharge port 111a formed in the nozzle plate 112 owing to the meniscus effect of the ends of the overlapping part when used in the second to the eighth embodiments as well.

This application claims priorities from Japanese Patent Applications No. 2004-354793 filed Dec. 8, 2004, No. 2004-359934 filed Dec. 13, 2004, No. 2005-214675 filed Jul. 25, 2005 and No. 2005-320984 filed Nov. 4, 2005, which are hereby incorporated by reference herein.

What is claimed is:

1. A liquid discharge recording head comprising:
   a recording element including a discharge port for discharging liquid, and an electrically connecting portion arranged adjacent to the discharge port and receiving an electric signal for controlling the discharge of the discharge port;
   a flexible wiring substrate for covering at least a portion of the recording element, the flexible wiring substrate including each of a device hole for exposing the discharge port and a bonding hole arranged facing the electrically connecting portion independently; and
   a sealing agent for covering at least a portion of the electrically connecting portion and filled to at least a portion of the bonding hole.

2. The liquid discharge recording head according to claim 1, wherein the flexible wiring substrate includes an inner lead having at least a portion protruding towards the inner side of the bonding hole, and the recording element includes an electrode part adjacent to the discharge port, the distal end of the inner lead and the electrode part being electrically connected to form the electrically connecting portion.

3. The liquid discharge recording head according to claim 2, wherein the inner lead is separated from a main body of the flexible wiring substrate in a range from a position farther than a rim of an opening of the bonding hole when viewed from the electrically connecting portion to the electrically connecting portion.

4. The liquid discharge recording head according to claim 2, wherein the electrode part and the inner lead are each arranged in pluralities, and the flexible wiring substrate includes a film member for covering at least a portion of the bonding hole, the film member being arranged at a position on the same layer as a base film configuring the flexible wiring substrate and formed so that at least a position facing each electrode part is opened, and that the film member is extended in at least one side of the inner lead at least partially.

5. The liquid discharge recording head according to claim 2, wherein the electrode part and the inner lead are each arranged in pluralities, and the flexible wiring substrate includes a metal pattern member for covering at least a portion of the bonding hole, the metal pattern member being arranged at a position on the same layer as a metal wiring connected to the inner lead in the flexible wiring substrate, and formed so that at least a position facing each electrode part is opened, and that the metal pattern member is extended in at least one side of the inner lead at least partially.

6. The liquid discharge recording head according to claim 2, wherein at least a portion of the sealing agent filled to at least a portion of the bonding hole is a sealing agent having a component different from that of another portion of the sealing agent.

7. The liquid discharge recording head according to claim 2, wherein a holding member for holding the sealing agent before curing is arranged on a top surface of the sealing agent filled in the bonding hole.

8. The liquid discharge recording head according to claim 7, wherein a sealing agent, same as the sealing agent for covering at least a portion of the electrically connecting portion, is arranged so as to cover the holding member in at least the bonding hole.

9. The liquid discharge recording head according to claim 7, wherein a sealing agent different from the sealing agent for covering at least a portion of the electrically connecting portion is arranged so as to cover the holding member in at least the bonding hole.

10. The liquid discharge recording head according to claim 1, wherein the recording element includes a groove extending along a separating band between the device hole and the bonding hole at a position facing the separating band.

11. The liquid discharge recording head according to claim 1, wherein a side facing the bonding hole of the device hole is, at the vicinity of the end, bent in a direction separating away from the recording element.

12. The liquid discharge recording head according to claim 1, wherein the width of the bonding hole is smaller than the width of the device hole.

13. The liquid discharge recording head according to claim 12, wherein the width of the bonding hole is smaller than the width of the recording element.

14. An ink jet recording apparatus comprising:
a liquid discharge recording head according to any one of claims 1 to 13; and
electrically connecting means for supplying a drive signal to the electrically connecting portion sealed with the sealing agent of the liquid discharge recording head from a main body of the ink jet recording apparatus.

* * * * *